United States Patent
Lee et al.

(10) Patent No.: US 11,038,034 B2
(45) Date of Patent: Jun. 15, 2021

(54) METHOD AND RELATED APPARATUS FOR INTEGRATING ELECTRONIC MEMORY IN AN INTEGRATED CHIP

(71) Applicant: Taiwan Semiconductor Manufacturing Co., Ltd., Hsin-Chu (TW)

(72) Inventors: Tung Ying Lee, Hsinchu (TW); Shao-Ming Yu, Zhubei (TW); Tzu-Chung Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/394,152

(22) Filed: Apr. 25, 2019

(65) Prior Publication Data
US 2020/0343302 A1 Oct. 29, 2020

(51) Int. Cl.
*H01L 21/28* (2006.01)
*H01L 29/423* (2006.01)
(Continued)

(52) U.S. Cl.
CPC .. *H01L 29/42364* (2013.01); *H01L 21/28158* (2013.01); *H01L 27/228* (2013.01);
(Continued)

(58) Field of Classification Search
CPC ....... H01L 21/28158; H01L 21/823462; H01L 21/823857; H01L 27/228; H01L 27/2436;
(Continued)

(56) References Cited

U.S. PATENT DOCUMENTS

| 2007/0176242 A1* | 8/2007 | Lee ................ H01L 21/823857 |
| | | 257/369 |
| 2012/0161237 A1* | 6/2012 | Jan ..................... H01L 21/2822 |
| | | 257/368 |

(Continued)

OTHER PUBLICATIONS

Lapedus, Mark. "What's Next for Atomic Layer Etch?" Semiconductor Engineering. Published on Nov. 16, 2017.
(Continued)

*Primary Examiner* — Eric A. Ward
(74) *Attorney, Agent, or Firm* — Eschweiler & Potashnik, LLC

(57) ABSTRACT

In some embodiments, a method for forming an integrated chip (IC) is provided. The method incudes forming an interlayer dielectric (ILD) layer over a substrate. A first opening is formed in the ILD layer and in a first region of the IC. A second opening is formed in the ILD layer and in a second region of the IC. A first high-k dielectric layer is formed lining both the first and second openings. A second dielectric layer is formed on the first high-k dielectric layer and lining the first high-k dielectric layer in both the first and second regions. The second high-k dielectric layer is removed from the first region. A conductive layer is formed over both the first and second high-k dielectric layers, where the conductive layer contacts the first high-k dielectric layer in the first region and contacts the second high-k dielectric in the second region.

20 Claims, 21 Drawing Sheets

(51) Int. Cl.
    *H01L 27/22* (2006.01)
    *H01L 29/51* (2006.01)
    *H01L 29/78* (2006.01)
    *H01L 29/66* (2006.01)

(52) U.S. Cl.
    CPC .......... *H01L 29/513* (2013.01); *H01L 29/517* (2013.01); *H01L 29/66492* (2013.01); *H01L 29/66545* (2013.01); *H01L 29/7833* (2013.01)

(58) Field of Classification Search
    CPC ......... H01L 29/42364; H01L 29/42368; H01L 29/513; H01L 29/517; H01L 29/66492; H01L 29/66545; H01L 29/7833
    See application file for complete search history.

(56) References Cited

U.S. PATENT DOCUMENTS

| | | | |
|---|---|---|---|
| 2013/0207200 A1* | 8/2013 | Lu ................... | H01L 21/823462 257/401 |
| 2013/0237046 A1* | 9/2013 | Lin ..................... | H01L 29/513 438/591 |
| 2016/0315080 A1* | 10/2016 | Song ................ | H01L 29/66545 |

OTHER PUBLICATIONS

Li et al. "A Ferroelectric Thin Film Transistor Based on Annealing-Free HfZrO Film." Journal of the Electron Devices Society, vol. 5, No. 5, Sep. 2017.

\* cited by examiner

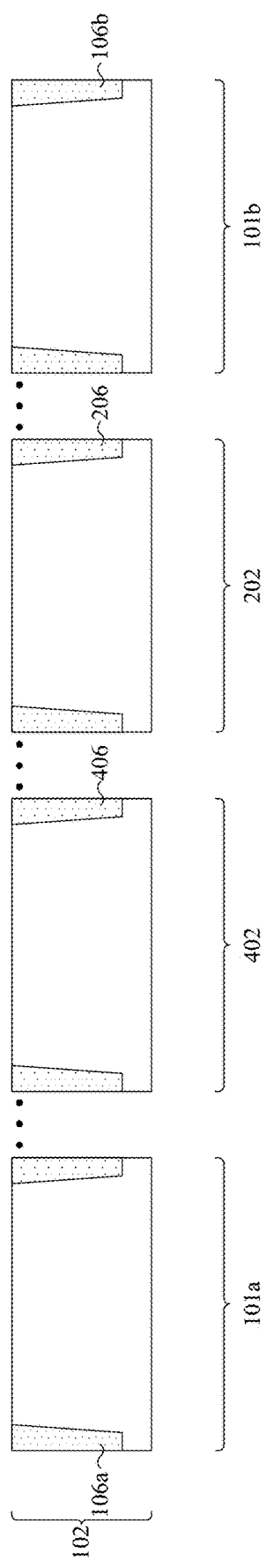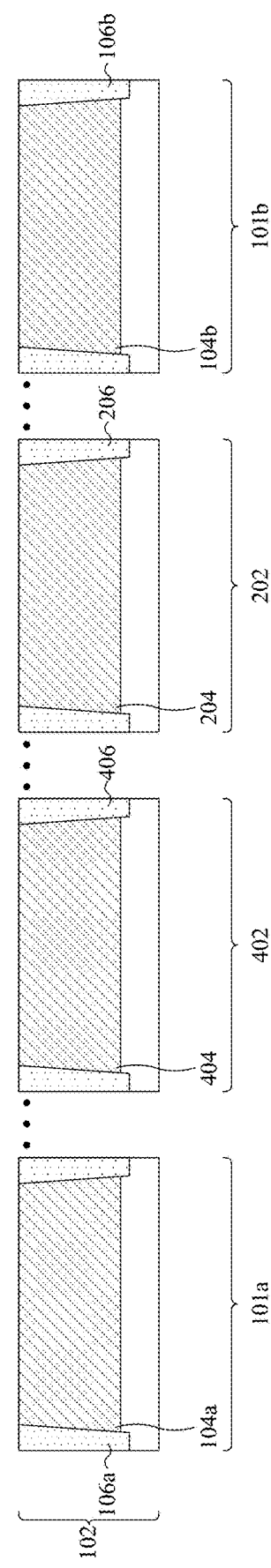

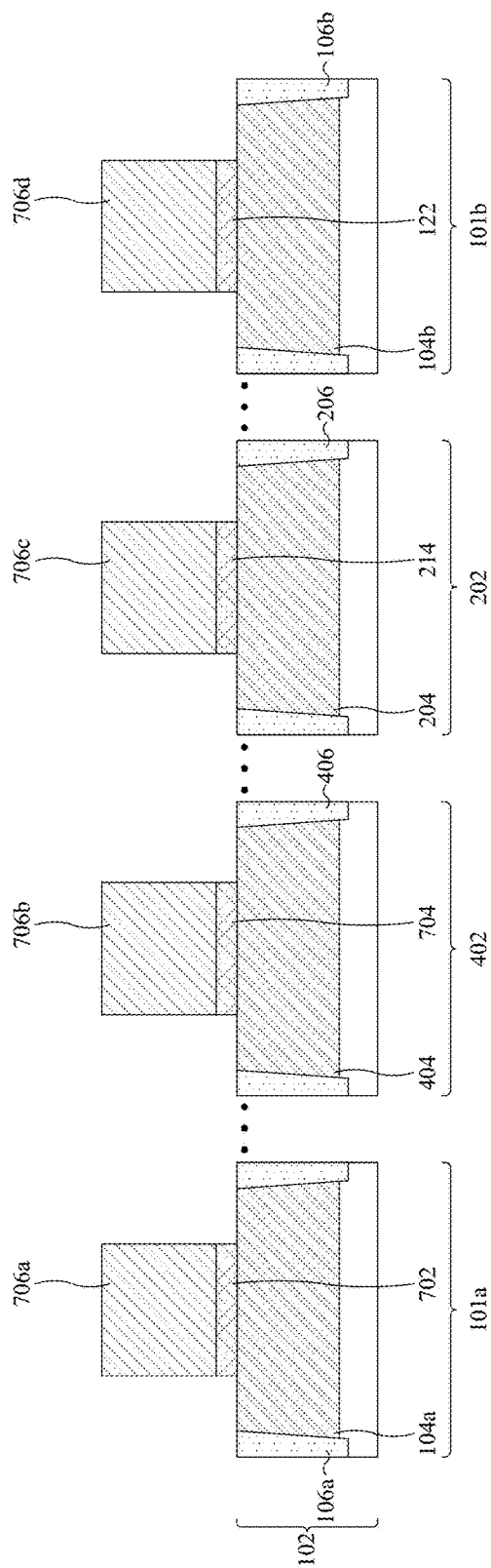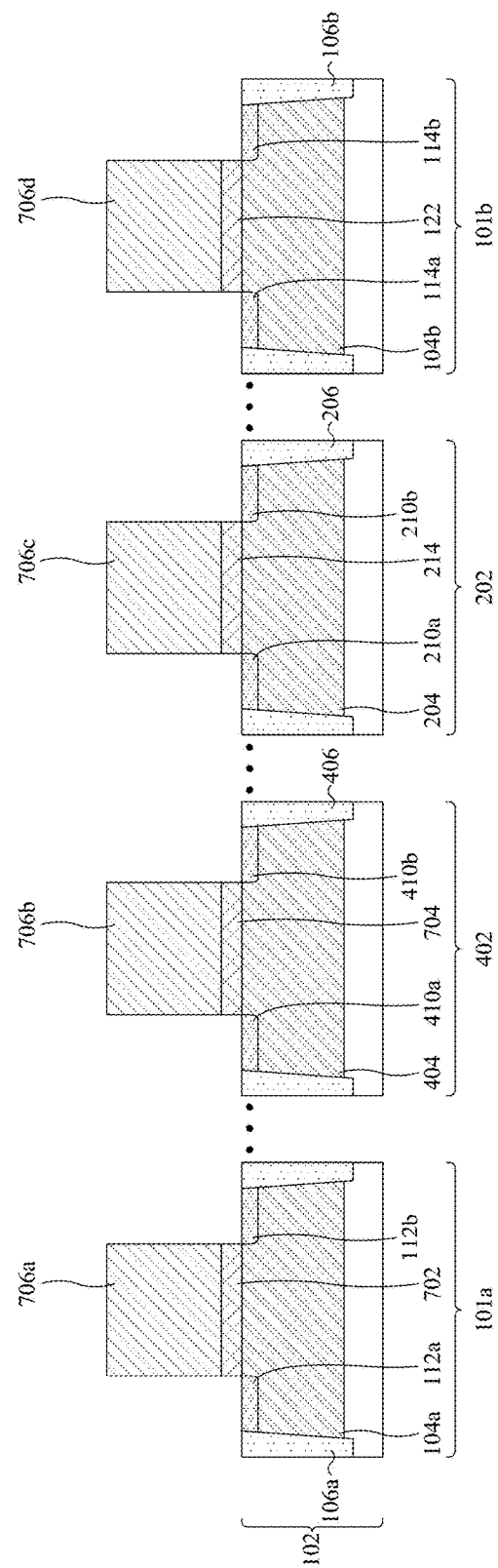

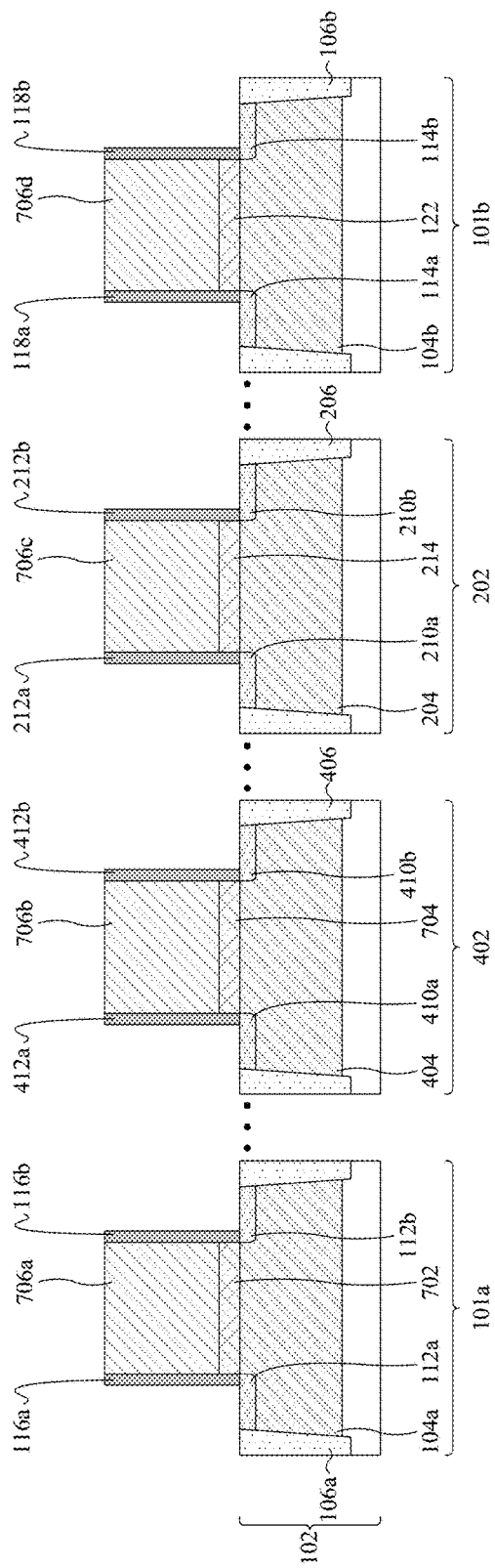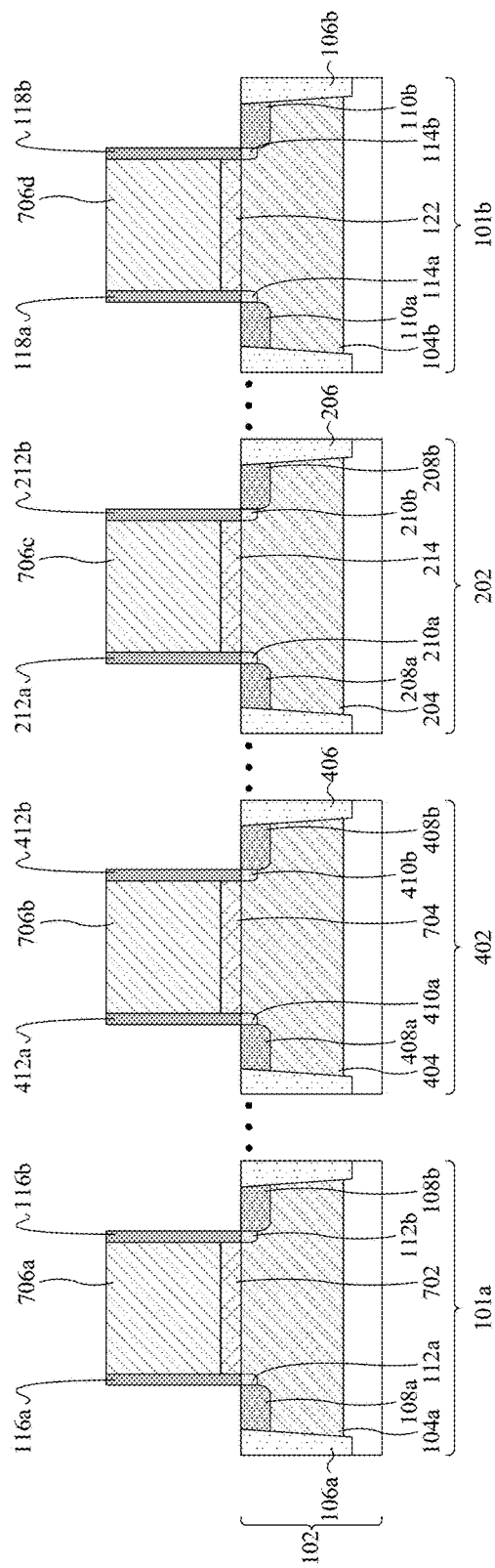

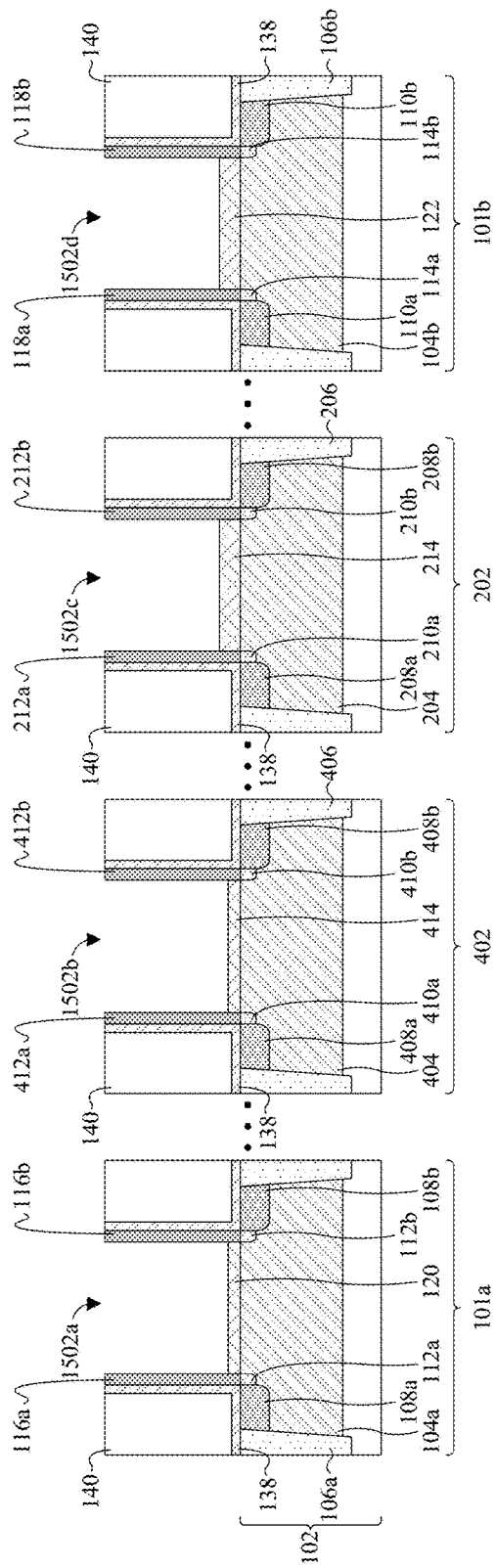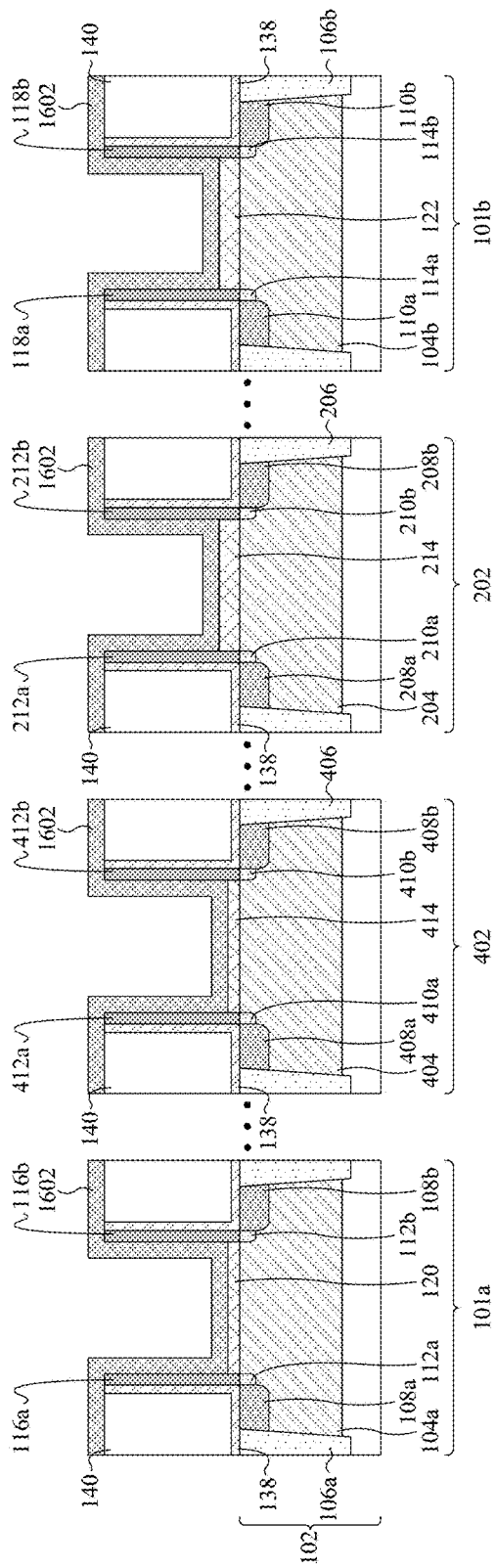

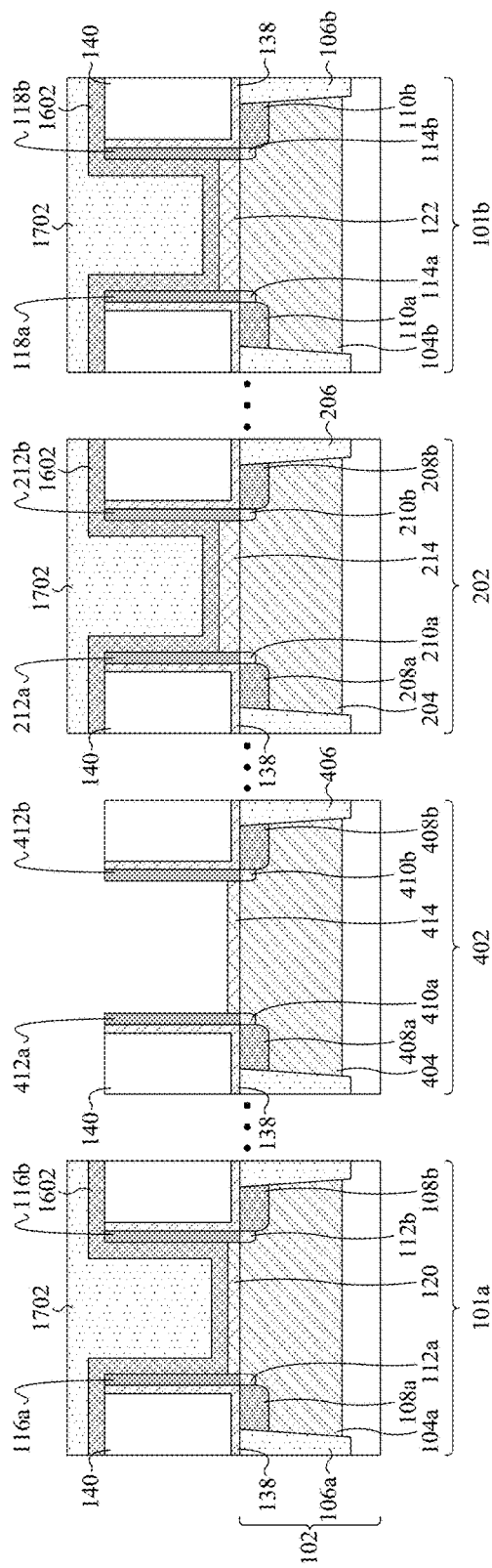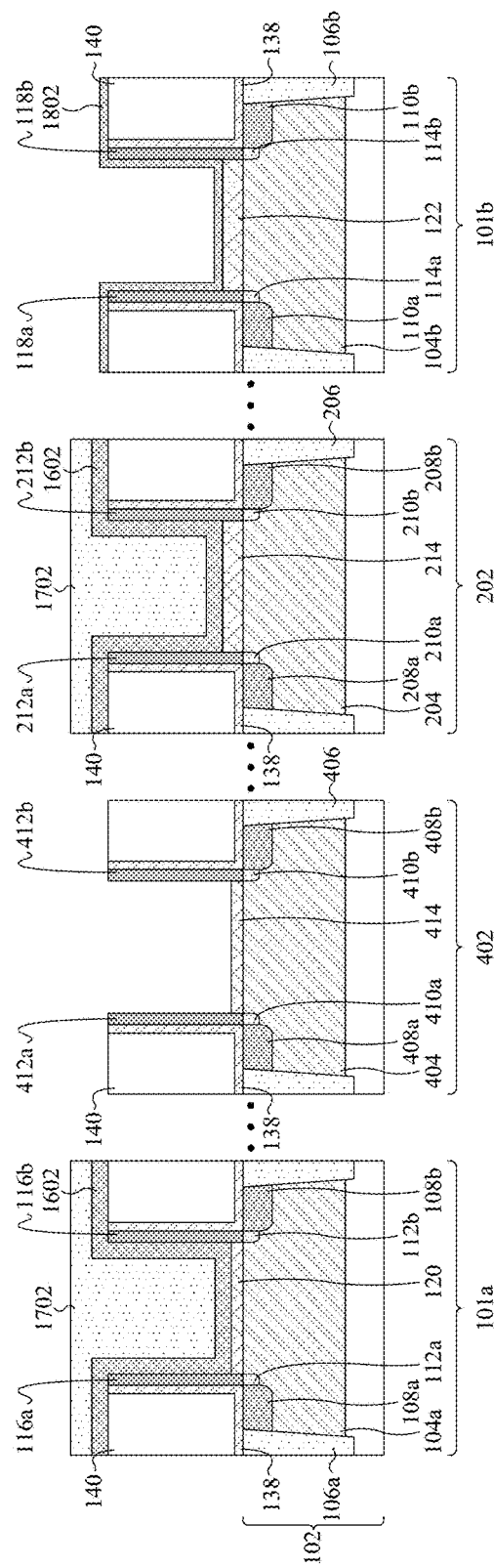

METHOD AND RELATED APPARATUS FOR INTEGRATING ELECTRONIC MEMORY IN AN INTEGRATED CHIP

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include magnetoresistive random-access memory (MRAM), resistive random-access memory (RRAM), phase-change random-access memory (PCRAM), and conductive-bridging random-access memory (CBRAM). In some next generation electronic memory, a transistor is coupled to a memory cell and is configured to provide a voltage to the memory cell during various memory operations (e.g., SET, RESET, etc.). However, as technology nodes decrease, there are challenges with the transistor providing sufficient voltage to the memory cell to support the various memory operations. In some embodiments, the next generation electronic memory is integrated in an integrated chip (IC) with other semiconductor devices (e.g., logic transistors, input/output (I/O) transistors, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-30 illustrate a series of cross-sectional views of some embodiments of a method for forming the IC of FIG. 4.

DETAILED DESCRIPTION

Figure 1:
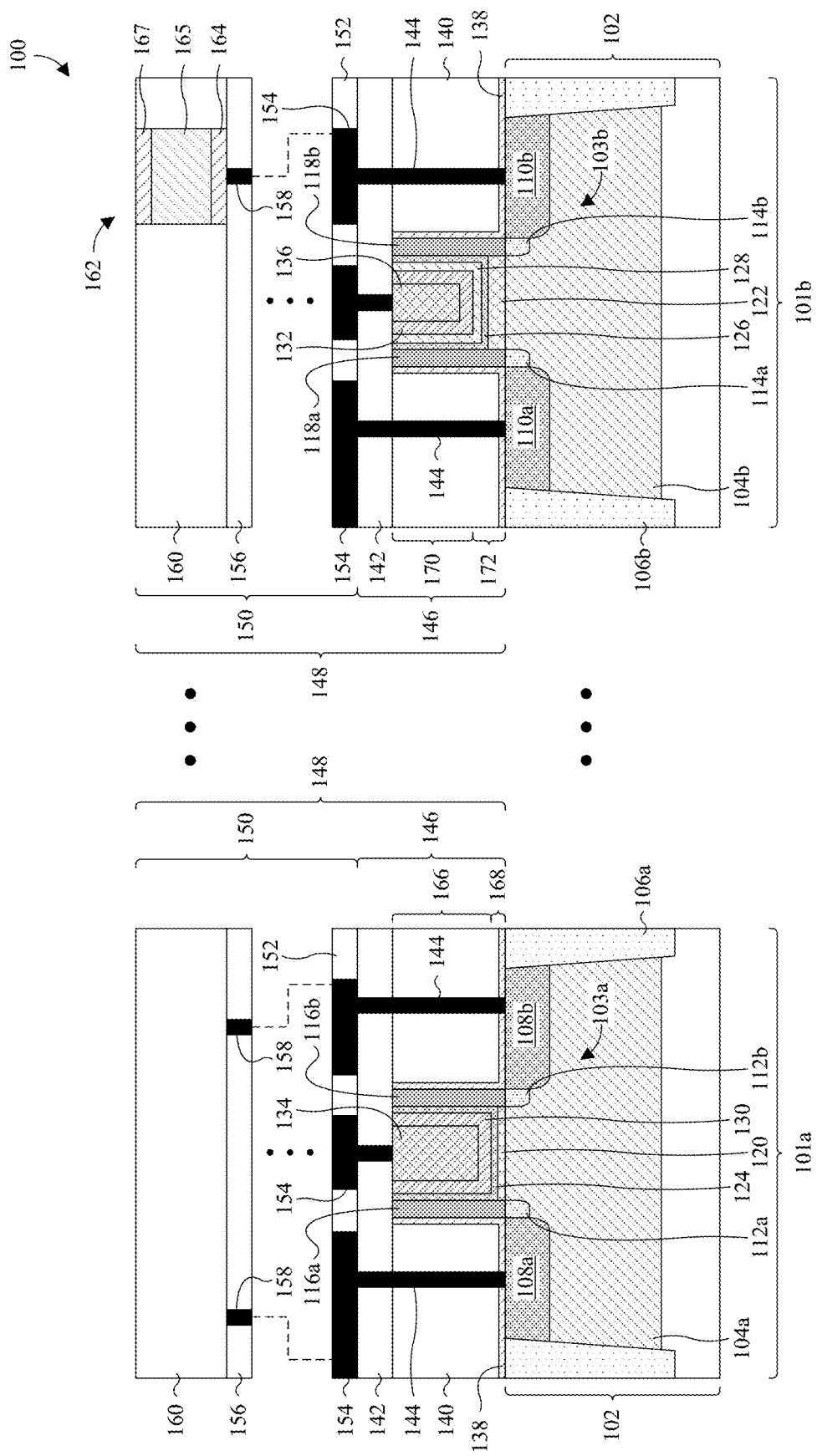
FIG. 1 illustrates a cross-sectional view of some embodiments of an integrated chip (IC) comprising a first semiconductor device and a second semiconductor device having different output voltages, where the second semiconductor device is electrically coupled to a resistive memory cell.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise a logic region and a memory region. The logic region comprises a plurality of first semiconductor devices (e.g., metal-oxide semiconductor field-effect transistors (MOSFETs)) that are configured to output a first voltage. The memory region comprises a plurality of second semiconductor devices (e.g., MOSFETs) that are also configured to output the first voltage. The second semiconductor devices are electrically coupled to a plurality of resistive memory cells (e.g., next generation memory cells), respectively. Each of the second semiconductor devices are configured to provide voltages to one of the resistive memory cells to perform various memory operations (e.g., SET, RESET, etc.). However, the resistive memory cells require a second operating voltage that is greater than the first voltage to perform some of the memory operations (e.g., RESET). Thus, an overdrive scheme (e.g., overdrive voltage scheme) is typically employed on the second semiconductor devices to increase the voltage output by the second semiconductor devices (e.g., the first voltage) to the second voltage.

A challenge with the above ICs is, as technology nodes decrease, integrating the first semiconductor devices, the second semiconductor devices, and the resistive memory cells in individual ICs. For example, as technology nodes scale down, feature sizes of the first semiconductor devices and the second semiconductor devices decrease, which improves performance, reduces power consumption, and increases a density of the first semiconductor devices and the second semiconductor devices. However, by decreasing features sizes, output voltages of the first semiconductor devices and/or the second semiconductor devices may decrease. Thus, as technology nodes decrease (e.g., beyond 10 nanometers), the output voltages of the second semiconductor devices may be insufficient to operate (e.g., provide a voltage during a RESET operation) the resistive memory cells. Accordingly, integrating resistive memory cells in individual ICs may be hindered as technology nodes decrease.

Various embodiments of the present application are directed toward a method (and related apparatus) of forming an integrated circuit (IC) comprising a first semiconductor device and a second semiconductor having different output voltages, where the second semiconductor device is electrically coupled to a resistive memory cell. The method comprises forming a first gate dielectric, which correspond to the first semiconductor device, on a semiconductor substrate, where the first gate dielectric comprises a first dielectric structure (e.g., a first high-k dielectric structure). A second gate dielectric, which correspond to the second semiconductor device, is formed on the semiconductor substrate, where the second gate dielectric comprises the first dielectric structure and a second gate dielectric structure (e.g., a second high-k dielectric structure). A resistive memory cell is formed over the semiconductor substrate and electrically coupled to the second semiconductor device. In some embodiments, the method comprises one or more etching processes that may thin (e.g., reduce a thickness of) the first dielectric structure and/or the second dielectric structure in the second region.

Because the second gate dielectric comprises the first dielectric structure and the second dielectric structure, a capacitance of the second gate dielectric may be different (e.g., greater) than a capacitance of the first gate dielectric. Because the capacitances of the first gate dielectric and the second gate dielectric may be different, an output voltage of the second semiconductor device may be different (e.g., greater) than an output voltage of the first semiconductor device. Therefore, the output voltage of the second semiconductor device may be sufficient to operate the resistive memory cell. Thus, the method may improve integrating resistive memory cells into individual ICs as technology nodes decrease. In further embodiments, because the first dielectric structure and/or the second dielectric structure may be thinned in the second region, the capacitance of the second gate dielectric may be selectively tuned in relation to the capacitance of the first gate dielectric. Accordingly, the method may further improve integrating resistive memory cells into individual ICs as technology nodes decrease.

FIG. 1 illustrates a cross-sectional view of some embodiments of an integrated chip (IC) 100 comprising a first semiconductor device 103a and a second semiconductor device 103b having different output voltages, where the second semiconductor device 103b is electrically coupled to a resistive memory cell 162.

As shown in FIG. 1, the IC 100 comprises a semiconductor substrate 102. In some embodiments, the semiconductor substrate 102 comprises any type of semiconductor body (e.g., monocrystalline silicon/CMOS bulk, silicon-germanium (SiGe), silicon on insulator (SOI), etc.). The semiconductor substrate 102 extends continuously from a first region 101a of the IC 100 to a second region 101b of the IC 100 (illustrated by an ellipsis between the first region 101a and the second region 101b).

A first well 104a and a second well 104b are disposed in the semiconductor substrate 102. The first well 104a is disposed in the first region 101a, and the second well 104b is disposed in the second region 101b. The first well 104a is a first doped region of the semiconductor substrate 102, and the second well 104b is a second doped region of the semiconductor substrate 102. In some embodiments, the first well 104a and the second well 104b have a first doping type (e.g., n-type). In other embodiments, the first well 104a has the first doping type, and the second well 104b has a second doping type (e.g., p-type) opposite the first doping type, or vice versa.

A first isolation structure 106a and a second isolation structure 106b are disposed in the semiconductor substrate 102. The first isolation structure 106a is disposed in the first region 101a, and the second isolation structure is disposed in the second region 101b. In some embodiments, the first isolation structure 106a and/or the second isolation structure 106b may be, for example, a shallow trench isolation (STI) structure, a deep trench isolation (DTI) structure, or the like.

A first pair of source/drain regions 108a-b are disposed in the semiconductor substrate 102. For example, a first source/drain region 108a and a second source/drain region 108b are disposed in the first region 101a and laterally spaced. In some embodiments, the first source/drain region 108a is a third doped region of the semiconductor substrate 102, and the second source/drain region 108b is a fourth doped region of the semiconductor substrate 102. In further embodiments, the first pair of source/drain regions 108a-b have an opposite doping type as the first well 104a. In yet further embodiments, the technology node in which the IC 100 is formed may define a maximum (and minimum) lateral spacing between the first source/drain region 108a and the second source/drain region 108b.

A second pair of source/drain regions 110a-b are disposed in the semiconductor substrate 102. For example, a third source/drain region 110a and a fourth source/drain region 110b are disposed in the second region 101b and laterally spaced. In some embodiments, the third source/drain region 110a is a fifth doped region of the semiconductor substrate 102, and the fourth source/drain region 110b is a sixth doped region of the semiconductor substrate 102. In further embodiments, the second pair of source/drain regions 110a-b have an opposite doping type as the second well 104b.

In some embodiments, the second pair of source/drain regions 110a-b may be laterally spaced by substantially the same distance as the first pair of source/drain regions 108a-b are laterally spaced. In further embodiments, the second pair of source/drain regions 110a-b may be laterally spaced by a different distance as the first pair of source/drain regions 108a-b are laterally spaced. In yet further embodiments, the technology node in which the IC 100 is formed may define a maximum (and minimum) lateral spacing between the third source/drain region 110a and the fourth source/drain region 110b.

A first pair of lightly-doped source/drain extensions 112a-b are disposed in the semiconductor substrate 102. For example, a first lightly-doped source/drain extension 112a and a second lightly-doped source/drain extension 112b are disposed in the first region 101a and laterally spaced. In some embodiments, the first lightly-doped source/drain extension 112a is a seventh doped region of the semiconductor substrate 102, and the second lightly-doped source/drain extension 112b is an eighth doped region of the semiconductor substrate 102. In further embodiments, the first pair of lightly-doped source/drain extensions 112a-b have a same doping type as the first pair of source/drain regions 108a-b.

A second pair of lightly-doped source/drain extensions 114a-b are disposed in the semiconductor substrate 102. For example, a third lightly-doped source/drain extension 114a and a fourth lightly-doped source/drain extension 114b are disposed in the second region 101b and laterally spaced. In some embodiments, the third lightly-doped source/drain extension 114a is a ninth doped region of the semiconductor substrate 102, and the fourth lightly-doped source/drain extension 114b is a tenth doped region of the semiconductor substrate 102. In further embodiments, the second pair of lightly-doped source/drain extensions 114a-b have a same doping type as the second pair of source/drain regions 110a-d.

A first pair of sidewall spacers 116a-b are disposed over the semiconductor substrate 102. For example, a first sidewall spacer 116a and a second sidewall spacer 116b are disposed in the first region 101a and laterally spaced. In some embodiments, the first sidewall spacer 116a and the second sidewall spacer 116b are disposed over the first lightly-doped source/drain extension 112a and the second lightly-doped source/drain extension 112b, respectively. In further embodiments, the first pair of sidewall spacers 116a-b may comprise, for example, an oxide (e.g., silicon dioxide ($SiO_2$)), a nitride (e.g., silicon nitride (e.g., SiN)), an oxy-nitride (e.g., silicon oxy-nitride ($SiO_XN_Y$)), some other dielectric material, or a combination of the foregoing. It will be appreciated that, in some embodiments, the first pair of sidewall spacers 116a-b may correspond to opposite portions of a first sidewall spacer.

A second pair of sidewall spacers 118a-b are disposed over the semiconductor substrate 102. For example, a third sidewall spacer 118a and a fourth sidewall spacer 118b are disposed in the second region 101b and laterally spaced. In some embodiments, the third sidewall spacer 118a and the fourth sidewall spacer 118b are disposed over the third lightly-doped source/drain extension 114a and the fourth lightly-doped source/drain extension 114b, respectively. In further embodiments, the second pair of sidewall spacers 118a-b may comprise, for example, an oxide (e.g., silicon dioxide ($SiO_2$)), a nitride (e.g., silicon nitride (e.g., SiN)), an oxy-nitride (e.g., silicon oxy-nitride ($SiO_XN_Y$)), some other dielectric material, or a combination of the foregoing. It will be appreciated that, in some embodiments, the second pair of sidewall spacers 118a-b may correspond to opposite portions of a second sidewall spacer.

In some embodiments, the first pair of sidewall spacers 116a-b may be spaced apart by about a same distance as the second pair of sidewall spacers 118a-b. In other embodiments, the first pair of sidewall spacers 116a-b may be spaced apart by a different distance as the second pair of sidewall spacers 118a-b. In further embodiments, the technology node in which the IC 100 is formed may define a maximum distance the first pair of sidewall spacers 116a-b and/or the second pair of sidewall spacers 118a-b may be spaced apart.

In some embodiments, a height of the first pair of sidewall spacers 116a-b may be substantially the same as a height of the second pair of sidewall spacers 118a-b. In other embodiments, the height of the first pair of sidewall spacers 116a-b may be different than the height of the second pair of sidewall spacers 118a-b. In further embodiments, the technology node in which the IC 100 is formed may define a maximum height of the first pair of sidewall spacers 116a-b and/or the second pair of sidewall spacers 118a-b.

A first dielectric structure 120 is disposed on the semiconductor substrate 102 and between the first pair of sidewall spacers 116a-b. In some embodiments, the first dielectric structure 120 may comprise, for example, silicon dioxide (e.g., $SiO_2$). A second dielectric structure 122 is disposed on the semiconductor substrate 102 and between the second pair of sidewall spacers 118a-b. In some embodiments, the second dielectric structure 122 may comprise, for example, $SiO_2$. In further embodiments the first dielectric structure 120 may be referred to as a first interfacial layer (IL), and the second dielectric structure 122 may be referred to as a second IL. In yet further embodiments, the first IL and the second IL may comprise a same chemical composition and/or differ only in height.

In some embodiments, a height of the second dielectric structure 122 may be greater than a height of the first dielectric structure 120. In further embodiments, an area of first dielectric structure 120 and an area of the second dielectric structure 122 may be substantially the same. For example, a surface area of an upper surface of the first dielectric structure 120 may be substantially the same as a surface area of an upper surface of the second dielectric structure 122.

A third dielectric structure 124 is disposed over the first dielectric structure 120 and between the first pair of sidewall spacers 116a-b. The third dielectric structure 124 may line an upper surface of the first dielectric structure 120 and the inner sidewalls of the first pair of sidewall spacers 116a-b. In some embodiments, an upper surface of the third dielectric structure 124 may be substantially co-planar with upper surfaces of the first pair of sidewall spacers 116a-b.

In some embodiments, the third dielectric structure 124 may comprise, for example, hafnium zirconium oxide ($Hf_XZr_YO_2$), a hafnium based oxide (e.g., hafnium dioxide ($HfO_2$)), a zirconium based oxide (e.g., zirconium dioxide ($ZrO_2$)), some other dielectric material having a dielectric constant greater than about 3.9, or a combination of the foregoing. In further embodiments, a thickness of the third dielectric structure 124 may be between about 0 nanometers (nm) and about 1 nm. More specifically, the thickness of the third dielectric structure 124 may be between about 0 angstrom and about 50 angstrom. In yet further embodiments, the third dielectric structure 124 may be referred to as a first high-k dielectric structure (e.g., comprising a dielectric material having a dielectric constant greater than about 3.9).

A fourth dielectric structure 126 is disposed over the second dielectric structure 122 and between the second pair of sidewall spacers 118a-b. The fourth dielectric structure 126 may line an upper surface of the second dielectric structure 122 and the inner sidewalls of the second pair of sidewall spacers 118a-b. In some embodiments, an upper surface of the fourth dielectric structure 126 may be substantially co-planar with upper surfaces of the second pair of sidewall spacers 118a-b.

In some embodiments, the fourth dielectric structure 126 may comprise, for example, hafnium zirconium oxide ($Hf_XZr_YO_2$), a hafnium based oxide (e.g., $HfO_2$), a zirconium based oxide (e.g., $ZrO_2$), some other dielectric material having a dielectric constant greater than about 3.9, or a combination of the foregoing. A chemical composition of the fourth dielectric structure 126 may be the same as a chemical composition of the third dielectric structure 124. In further embodiments, a thickness of the fourth dielectric structure 126 may be between about 0 nm and about 1 nm. More specifically, the thickness of the fourth dielectric structure 126 may be between about 0 angstrom and about 50 angstrom. In further embodiments, the thickness of the fourth dielectric structure 126 may be less than or equal to the third dielectric structure 124. In yet further embodiments, the fourth dielectric structure 126 may be referred to as a second high-k dielectric structure.

A fifth dielectric structure 128 is disposed over the second dielectric structure 122 and between the second pair of sidewall spacers 118a-b. The fifth dielectric structure 128 may line an upper surface and inner surfaces of the fourth dielectric structure 126. In some embodiments, an upper surface of the fifth dielectric structure 128 may be substantially co-planar with the upper surfaces of the second pair of sidewall spacers 118a-b and/or substantially co-planar with the upper surface of the fourth dielectric structure 126.

In some embodiments, the fifth dielectric structure 128 may comprise, for example, hafnium zirconium oxide ($Hf_xZr_yO_2$), a hafnium based oxide (e.g., $HfO_2$), a zirconium based oxide (e.g., $ZrO_2$), or some other dielectric material having a dielectric constant greater than about 3.9, or a combination of the foregoing. In further embodiments, a chemical composition of the fifth dielectric structure 128 may be different than the chemical composition of the third dielectric structure 124 and/or the fourth dielectric structure 126. A thickness of the fifth dielectric structure 128 may be between about 0 nm and about 1 nm. More specifically, the thickness of the fifth dielectric structure 128 may be between about 0 angstrom and about 50 angstrom. In further embodiments, a combined thickness of the fifth dielectric structure 128 and the fourth dielectric structure 126 may be between about 0 nm and about 2 nm. More specifically, the combined thickness of the fifth dielectric structure 128 and the fourth dielectric structure 126 may be between about 0 angstrom and about 100 angstrom. In yet further embodiments, the fifth dielectric structure 128 may be referred to as a third high-k dielectric structure.

In some embodiments, the third dielectric structure 124, the fourth dielectric structure 126, and the fifth dielectric structure 128 have different chemical compositions than both the first dielectric structure 120 and the second dielectric structure 122. For example, the first dielectric structure 120 and the second dielectric structure 122 may comprise an oxide (e.g., $SiO_2$), and the third dielectric structure 124, the fourth dielectric structure 126, and the fifth dielectric structure 128 may comprise high-k dielectrics (e.g., $Hf_xZr_yO_2$, $HfO_2$, $ZrO_2$, etc.). In further embodiments, the third dielectric structure 124, the fourth dielectric structure 126, and the fifth dielectric structure 128 have dielectric constants that are greater than the dielectric constants of the first dielectric structure 120 and the second dielectric structure 122.

In some embodiments, the fourth dielectric structure 126 and the third dielectric structure 124 may comprise a same chemical composition (e.g., a same high-k dielectric material (e.g., $Hf_xZr_yO_2$)) and/or have different thicknesses. In such embodiments, the fifth dielectric structure 128 and the third dielectric structure 124 comprise different chemical compositions (e.g., different high-k dielectrics). In further such embodiments, the thicknesses of the fifth dielectric structure 128 and the third dielectric structure 124 may be substantially the same or different.

In other embodiments, the fifth dielectric structure 128 and the third dielectric structure 124 may comprise a same chemical composition (e.g., a same high-k dielectric material (e.g., $Hf_xZr_yO_2$)) and/or have different thicknesses. In such embodiments, the fourth dielectric structure 126 and the third dielectric structure 124 comprise different chemical compositions (e.g., different high-k dielectrics). In further such embodiments, the thicknesses of the fourth dielectric structure 126 and the third dielectric structure 124 may be substantially the same or different.

A first capping structure 130 is disposed over the first dielectric structure 120 and between the first pair of sidewall spacers 116a-b. The first capping structure 130 may line an upper surface and inner surfaces of the third dielectric structure 124. In some embodiments, the first capping structure 130 may comprise, for example, titanium nitride (TiN), tantalum nitride (TaN), or the like. In further embodiments, upper surfaces of the first capping structure 130 may be substantially co-planar with the upper surfaces of the first pair of sidewall spacers 116a-b and/or substantially co-planar with the upper surfaces of the third dielectric structure 124.

A second capping structure 132 is disposed over the second dielectric structure 122 and between the second pair of sidewall spacers 118a-b. The second capping structure 132 may line an upper surface and inner surfaces of the fifth dielectric structure 128. In some embodiments, the second capping structure 132 may comprise, for example, TiN, TaN, or the like. In further embodiments, a chemical composition of the second capping structure 132 may be the same as a chemical composition of the first capping structure 130. In yet further embodiments, upper surfaces of the second capping structure 132 may be substantially co-planar with the upper surfaces of the second pair of sidewall spacers 118a-b, the upper surfaces of the fourth dielectric structure 126, and/or the upper surfaces of the fifth dielectric structure 128.

A first conductive structure 134 is disposed over the first dielectric structure 120 and between the first pair of sidewall spacers 116a-b. The first conductive structure 134 may be disposed on the first capping structure 130. In some embodiments, the first conductive structure 134 may comprise, for example, tungsten, titanium, aluminum, titanium silicide, nickel silicide, some other conductive material, or a combination of the foregoing. In further embodiments, the first conductive structure 134 may have an upper surface that is co-planar with an upper surface of the first capping structure 130.

A second conductive structure 136 is disposed over the second dielectric structure 122 and between the second pair of sidewall spacers 118a-b. The second conductive structure 136 may be disposed on the second capping structure 132. In some embodiments, the second conductive structure 136 may comprise, for example, tungsten, titanium, aluminum, titanium silicide, nickel silicide, some other conductive material, or a combination of the foregoing. In further embodiments, a chemical composition of the second conductive structure 136 may be the same as the chemical composition of the first conductive structure 134. In yet further embodiments, the second conductive structure 136 may have an upper surface that is co-planar with an upper surface of the second capping structure 132.

A contact etch stop layer (CESL) 138 is disposed on the semiconductor substrate 102 in both the first region 101a and the second region 101b. In some embodiments, the CESL 138 extends laterally over the first source/drain region 108a and vertically along the first sidewall spacer 116a, extends laterally over the second source/drain region 108b and vertically along the second sidewall spacer 116b, extends laterally over the third source/drain region 110a and vertically along the third sidewall spacer 118a, and extends laterally over the fourth source/drain region 110b and vertically along the fourth sidewall spacer 118b. In some embodiments, the CESL 138 may comprise, for example, an oxide (e.g., $SiO_2$), a nitride (e.g., SiN), an oxy-nitride (e.g., $SiO_xN_y$), some other dielectric material, or a combination of the foregoing.

A first interlayer dielectric (ILD) layer 140 is disposed on the CESL 138 in both the first region 101a and the second region 101b. In some embodiments, upper surfaces of the first ILD layer 140, the CESL 138, the first pair of sidewall spacers 116a-b, the third dielectric structure 124, the first capping structure 130, the first conductive structure 134, the second pair of sidewall spacers 118a-b, the fourth dielectric structure 126, the fifth dielectric structure 128, the second capping structure 132, and/or the second conductive structure 136 may be substantially co-planar. A second ILD layer 142 is disposed over the first ILD layer 140, the CESL 138, the first semiconductor device 103a, and the second semiconductor device 103b. In further embodiments, the second ILD layer 142 may contact the first ILD layer 140, the CESL 138, the first pair of sidewall spacers 116a-b, the third dielectric structure 124, the first capping structure 130, the first conductive structure 134, the second pair of sidewall spacers 118a-b, the fourth dielectric structure 126, the fifth dielectric structure 128, the second capping structure 132, and/or the second conductive structure 136. In yet further embodiments, the first ILD layer 140 and the second ILD layer 142 may comprise, for example, a low-k dielectric (e.g., a dielectric material with a dielectric constant less than about 3.9), an ultra-low-k dielectric, an oxide (e.g., $SiO_2$), some other dielectric material, or a combination of the foregoing.

A plurality of conductive contacts 144 extend through the second ILD layer 142 and the first ILD layer 140 to contact the first pair of source/drain regions 108a-b, the second pair of source/drain regions 110a-b, the first conductive structure 134, and the second conductive structure 136. In some embodiments, the plurality of conductive contacts 144 may comprise, for example, tungsten, copper, aluminum, some other conductive material, or a combination of the foregoing. In yet further embodiments, a lower portion 146 of an interconnect structure 148 comprises the CESL 138, the first ILD layer 140, the second ILD layer 142, and the plurality of conductive contacts 144. The interconnect structure 148 is configured to provide electrical connections between various devices disposed through the IC 100 (e.g., the second semiconductor device 103b and the resistive memory cell 162).

An upper portion 150 of the interconnect structure 148 is disposed over the lower portion 146. In some embodiments, the upper portion 150 comprises a third ILD layer 152 disposed over the second ILD layer 142 and the plurality of conductive contacts 144. A plurality of conductive lines 154 (e.g., metal lines) are disposed in the third ILD layer 152 and electrically coupled to the plurality of conductive contacts 144. In some embodiments, the conductive lines 154 may comprise, for example, copper, aluminum, or the like.

A fourth ILD layer 156 is disposed over the third ILD layer 152 and the plurality of conductive lines 154. A plurality of conductive vias 158 (e.g., metal vias) are disposed in the fourth ILD layer 156 and electrically coupled to the plurality of conductive lines 154 (as illustrated by a dashed line). In some embodiments, the conductive vias 158 may comprise, for example, copper, aluminum, or the like. It will be appreciated that, in some embodiments, a number of additional ILD layers and conductive lines/vias may be disposed between the third ILD layer 152 and the fourth ILD layer 156 (illustrated by an ellipsis between the third ILD layer 152 and the fourth ILD layer 156). Further, it will be appreciated, that in some embodiments, a plurality of metal lines are disposed in the fourth ILD layer 156 rather than the plurality of conductive vias 158. A fifth ILD layer 160 is disposed over the fourth ILD layer 156 and the plurality of conductive vias 158. In some embodiments, the third ILD layer 152, the fourth ILD layer 156, and the fifth ILD layer 160 may comprise, for example, a low-k dielectric (e.g., a dielectric material with a dielectric constant less than about 3.9), an ultra-low-k dielectric, an oxide (e.g., $SiO_2$), some other dielectric material, or a combination of the foregoing.

A resistive memory cell 162 is disposed in the fifth ILD layer 160. The resistive memory cell 162 is configured to store data (e.g., binary "0" or binary "1") based on a resistive state (e.g., a high resistive state or a low resistive state) of the resistive memory cell 162. The resistive memory cell 162 comprises a data storage structure 165 disposed between a first electrode 164 and a second electrode 167. In some embodiments, the first electrode 164 may be coupled to the fourth source/drain region 110b via the interconnect structure 148.

In some embodiments, the first electrode 164 and the second electrode 167 may comprise, for example, titanium, aluminum, tungsten, gold, platinum, or the like. In further embodiments, the data storage structure 165 may comprise, for example, a chalcogenide (e.g., germanium-antimony-tellurium (GST)), an oxide (e.g., $HFO_2$, $ZrO_2$, etc.), or some other material that may selectively change between a high resistive state (HRS) and a low resistive state (LRS). In yet further embodiments, the data storage structure 165 may be a magnetic tunnel junction (MTJ).

In some embodiments, the resistive memory cell 162 may be, for example, a resistive random-access memory (RRAM) cell, a phase-change random-access memory (PCRAM) cell, a magnetoresistive random-access memory (MRAM) cell, or a conductive-bridging random-access memory (CBRAM) cell. It will be appreciated that, in some embodiments, a plurality of resistive memory cells are disposed in an array in the fifth ILD layer 160, each of which may be electrically coupled to a source/drain region of a corresponding semiconductor device of the IC 100. In such embodiments, the plurality of resistive memory cells may only be disposed in the second region 101b, or the plurality of resistive memory cells may be disposed in both the first region 101a and the second region 101b.

In some embodiments, the first region 101a may be referred to as a core region. In such embodiments, the core region may comprise, for example, static random-access memory (SRAM) and/or one or more logic gates (e.g., AND gate, XOR gate, etc.). In further such embodiments, the SRAM and/or a logic gate may comprise the first semiconductor device 103a. In further embodiments, the second region 101b may be referred to as a memory region. In such embodiments, the second semiconductor device 103b may be an access transistor configured to control access to the resistive memory cell 162.

In some embodiments, the first capping structure 130 and the first conductive structure 134 define a first gate electrode 166. In further embodiments, the first dielectric structure 120 and a bottom portion of the third dielectric structure 124 that is disposed beneath the first gate electrode 166 and between the first pair of sidewall spacers 116a-b define a first gate dielectric 168. The first gate dielectric 168 has a first gate dielectric capacitance. In yet further embodiments, the first gate electrode 166 may be referred to as a first metal gate electrode.

In some embodiments, the second capping structure 132 and the second conductive structure 136 define a second gate electrode 170. In further embodiments, the second dielectric structure 122, a bottom portion of the fourth dielectric structure 126 disposed beneath the second gate electrode 170 and between the second pair of sidewall spacers 118a-b, and a bottom portion of the fifth dielectric structure 128 disposed beneath the second gate electrode 170 and between the second pair of sidewall spacers 118a-b define a second gate dielectric 172. The second gate dielectric 172 has a second gate dielectric capacitance. In some embodiments, the second gate dielectric capacitance is different than the first gate dielectric capacitance. In further embodiments, the second gate dielectric capacitance is greater than the first gate dielectric capacitance. In yet further embodiments, the second gate electrode 170 may be referred to as a second metal gate electrode.

Because the second gate dielectric capacitance may be different than the first gate dielectric capacitance, an output voltage of the second semiconductor device 103*b* (e.g., a voltage output at the fourth source/drain region 110*b*) may be different than an output voltage of the first semiconductor device 103*a* (e.g., a voltage output at the second source/drain region 108*b*). For example, the output voltage of the second semiconductor device 103*b* may be greater than the output voltage of the first semiconductor device 103*a* due to the second gate capacitance being greater than the first gate capacitance. Thus, the output voltage of the second semiconductor device 103*b* may be sufficient to operate the resistive memory cell 162. Accordingly, as technology nodes decrease, the first semiconductor device 103*a*, the second semiconductor device 103*b*, and the resistive memory cell 162 may be integrated on the IC 100.

In some embodiments, the output voltage of the first semiconductor device 103*a* may be less than or equal to about 1.5 volts (V). In further embodiments, the output voltage of the second semiconductor device 103*b* may be greater than or equal to about 1.5 V. In yet further embodiments, the resistive memory cell 162 may require a voltage greater than or equal to 1 V to operate correctly (e.g., correctly perform various memory operations). More specifically, the resistive memory cell 162 may require a voltage greater than or equal to 1.5 V to operate correctly.

Figure 2:
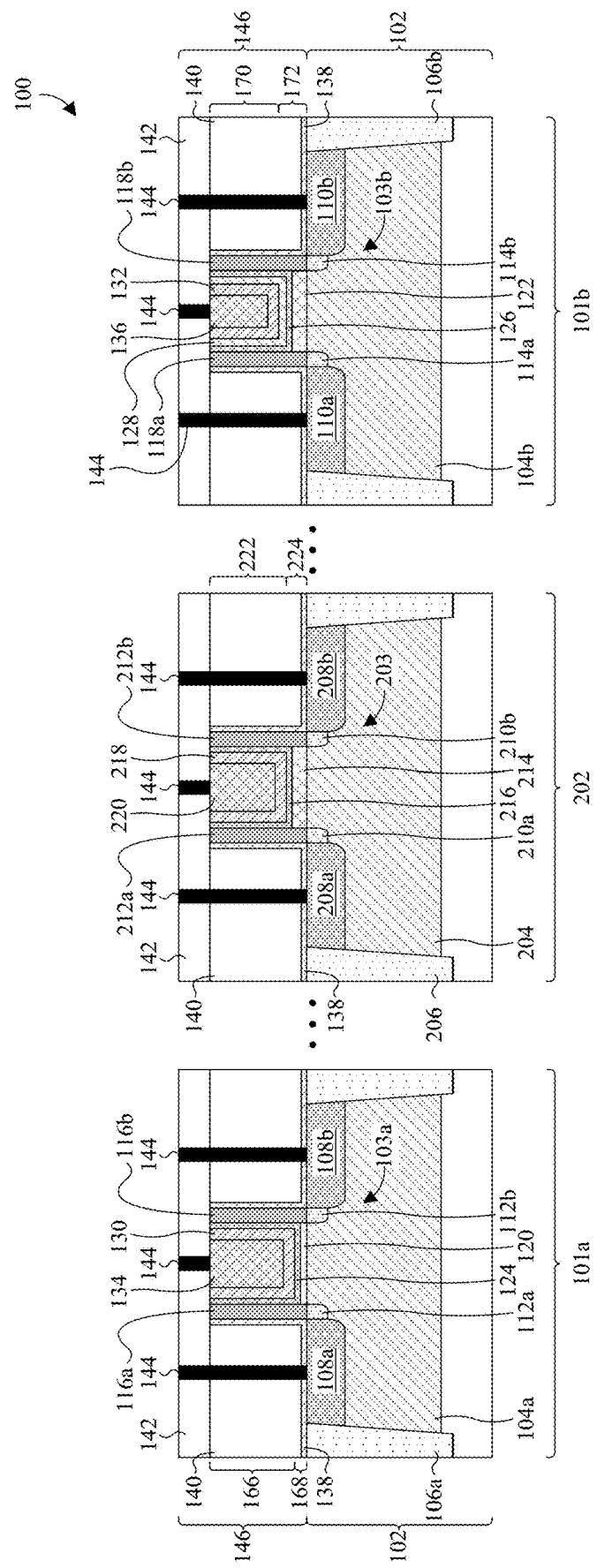
FIG. 2 illustrates a cross-sectional view of some other embodiments of the IC of FIG. 1.

FIG. 2 illustrates a cross-sectional view of some other embodiments of the IC 100 of FIG. 1. FIG. 2 illustrates the IC 100 of FIG. 1 with the upper portion 150 of the interconnect structure 148 removed.

As shown in FIG. 2, the IC 100 comprise a third region 202 of the IC 100 disposed between the first region 101*a* and the second region 101*b*. A third semiconductor device 203 is disposed in the third region 202. In some embodiments, a third well 204 is disposed in the semiconductor substrate 102. A third isolation structure 206 may be disposed in the semiconductor substrate 102. A third pair of source/drain regions 208*a-b* are disposed in the semiconductor substrate 102 and laterally spaced. It will be appreciated that, in some embodiments, the third region 202 may be disposed on either side of the first region 101*a* or the second region 101*b*.

In some embodiments, a third pair of lightly-doped source/drain extensions 210*a-b* are disposed in the semiconductor substrate 102 and laterally spaced. A third pair of sidewall spacers 212*a-b* are disposed over the semiconductor substrate 102 and spaced apart. A sixth dielectric structure 214 is disposed on the semiconductor substrate 102 and between the third pair of sidewall spacers 212*a-b*. A height of the sixth dielectric structure 214 may be greater than the height of the first dielectric structure 120. In further embodiments, the height of the sixth dielectric structure 214 may be about the same as the height of the second dielectric structure 122. In yet further embodiments, the sixth dielectric structure 214 may be referred to as a third IL.

A seventh dielectric structure 216 is disposed on the sixth dielectric structure 214 and between the third pair of sidewall spacers 212*a-b*. In some embodiments, a chemical composition of the seventh dielectric structure 216 may be substantially the same as a chemical composition of the third dielectric structure 124 and/or the fourth dielectric structure 126. In further embodiments, a thickness of the seventh dielectric structure 216 may be substantially the same as the thickness of the third dielectric structure 124 and/or the fourth dielectric structure 126. In yet further embodiments, a third capping structure 218 is disposed on the sixth dielectric structure 214 and between the third pair of sidewall spacers 212*a-b*. A third conductive structure 220 is disposed on the third capping structure 218 and between the third pair of sidewall spacers 212*a-b*.

In some embodiments, the third capping structure 218 and the third conductive structure 220 define a third gate electrode 222. In further embodiments, the sixth dielectric structure 214 and a bottom portion of the seventh dielectric structure 216 that is disposed beneath the third gate electrode 222 and between the third pair of sidewall spacers 212*a-b* define a third gate dielectric 224. The third gate dielectric 224 has a third gate dielectric capacitance.

In some embodiments, the third gate dielectric capacitance is different than the first gate dielectric capacitance and/or the second gate dielectric capacitance. In other embodiments, the third gate dielectric capacitance may be substantially the same as the first gate dielectric capacitance. In further embodiments, the second gate capacitance may be greater than both the first gate dielectric capacitance and the third gate dielectric capacitance. In yet further embodiments, the third gate electrode 222 may be referred to as a third metal gate electrode.

In some embodiments, the third region 202 may be referred to as an input/output (I/O) region. In such embodiments, the I/O region comprises input circuitry and output circuitry configured to interface between devices that are peripheral (e.g., sensors, memory, etc.) to the IC 100. In further such embodiments, the third semiconductor device 203 may be part of the input circuitry or the output circuitry.

FIGS. 3A-3D illustrate cross-sectional views of some embodiments of the second semiconductor device 103*b*, respectively.

Figure 3A:
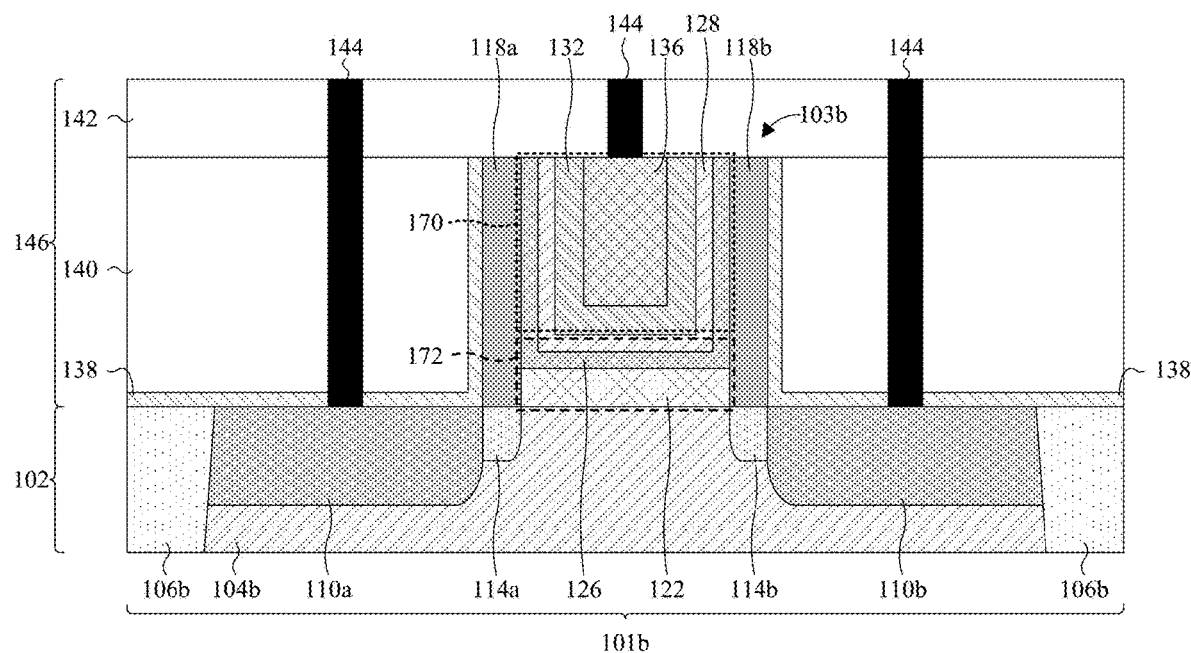
FIGS. 3A-3D illustrate cross-sectional views of some embodiments of the second semiconductor device, respectively.

As shown in FIG. 3A, the thickness of the fourth dielectric structure 126 and the thickness of the fifth dielectric structure 128 are substantially the same. In such embodiments, the output voltage of the second semiconductor device 103*b* may be a first voltage. In further such embodiments, the second gate dielectric 172 has a first height. The first height is a distance between an upper surface of the fifth dielectric structure 128 that is disposed directly between the second gate electrode 170 and the semiconductor substrate 102 and a bottom surface of the second dielectric structure 122 that is disposed directly between the second gate electrode 170 and the semiconductor substrate 102. In yet further such embodiments, the second gate electrode 170 has a second height. The second height is a distance between a bottom surface of the second capping structure 132 and an upper surface of the second conductive structure 136.

Figure 3B:
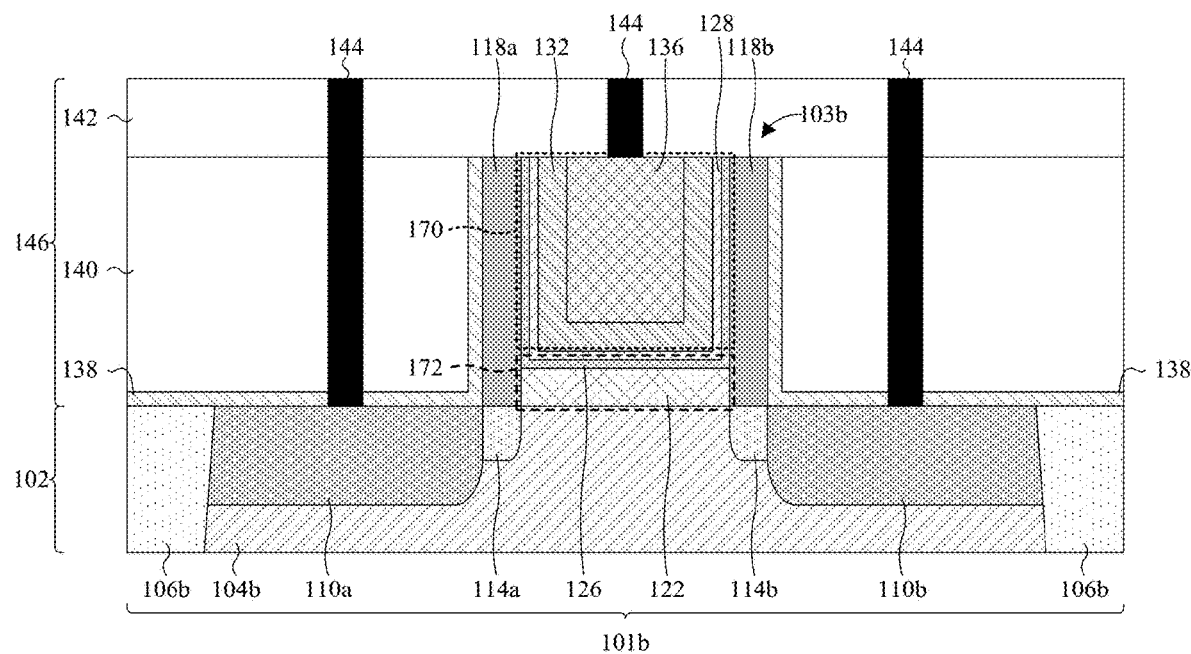

As shown in FIG. 3B, the thickness of the fourth dielectric structure 126 and the thickness of the fifth dielectric structure 128 are substantially the same, but the combined thickness of the fourth dielectric structure 126 and the fifth dielectric structure 128 is less than the combined thickness of the fourth dielectric structure 126 and the fifth dielectric structure 128 in FIG. 3A. In such embodiments, an output voltage of the second semiconductor device 103*b* may be a second voltage that is different than the first voltage. In further such embodiments, the second gate dielectric 172 may have a third height that is different than the first height. In yet further such embodiments, the second gate electrode 170 may have a fourth height that is different than the second height.

Figure 3C:
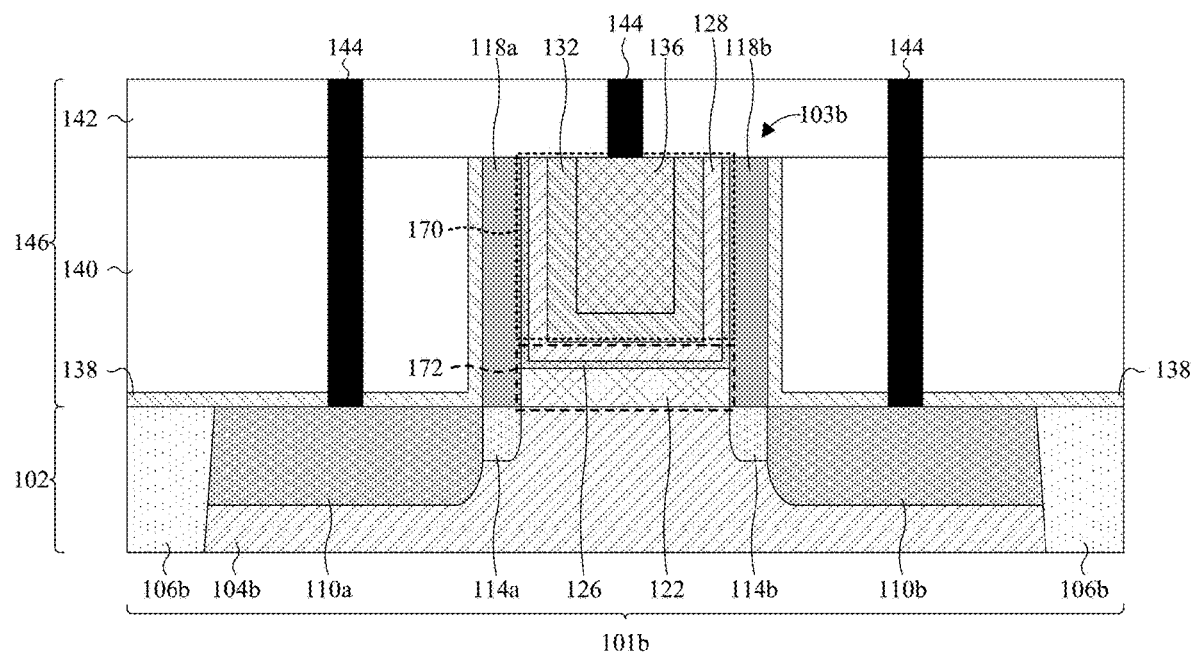

As shown in FIG. 3C, the thickness of the fourth dielectric structure 126 is less than a thickness of the fifth dielectric structure 128. In such embodiments, the output voltage of the second semiconductor device 103b may be a third voltage that is different than the first voltage and/or the second voltage.

Figure 3D:
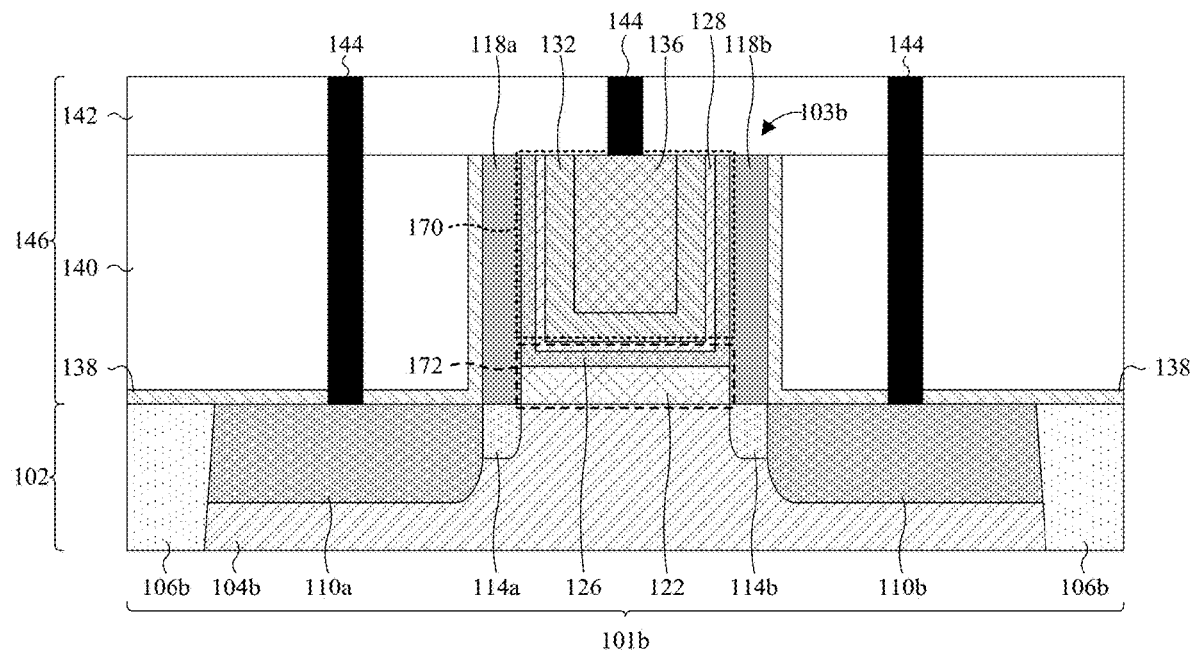

As shown in FIG. 3D, the thickness of the fourth dielectric structure 126 is greater than a thickness of the fifth dielectric structure 128. In such embodiments, the output voltage of the second semiconductor device 103b may be a fourth voltage that is different than the first voltage, second voltage, and/or third voltage.

Figure 4:
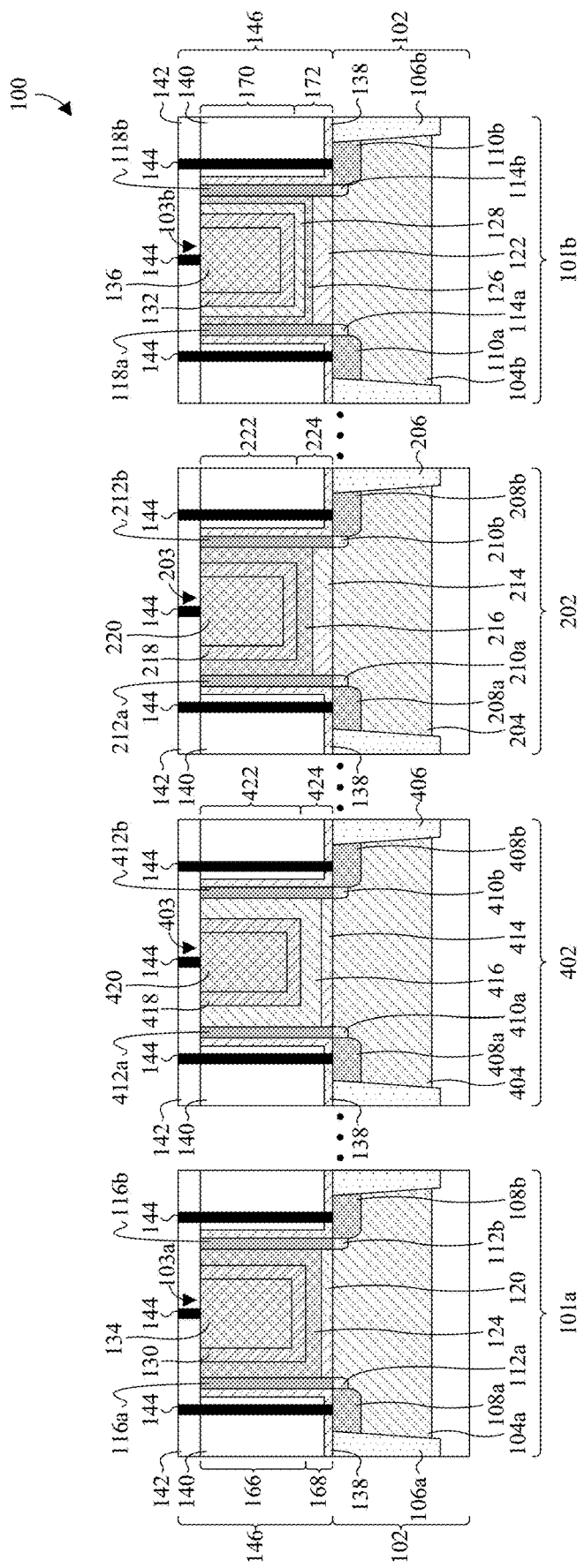
FIG. 4 illustrates a cross-sectional view of some other embodiments of the IC of FIG. 2.

FIG. 4 illustrates a cross-sectional view of some other embodiments of the IC 100 of FIG. 2.

As shown in FIG. 4, the IC 100 comprise a fourth region 402 of the IC 100 disposed between the first region 101a and the third region 202. A fourth semiconductor device 403 is disposed in the fourth region 402. In some embodiments, a fourth well 404 is disposed in the semiconductor substrate 102. A fourth isolation structure 406 may be disposed in the semiconductor substrate 102. A fourth pair of source/drain regions 408a-b are disposed in the semiconductor substrate 102 and laterally spaced apart. It will be appreciated that, in some embodiments, the fourth region 402 may be disposed on either side of the first region 101a, the second region 101b, and/or the third region 202.

In some embodiments, a fourth pair of lightly-doped source/drain extensions 410a-b are disposed in the semiconductor substrate 102 and laterally spaced. A fourth pair of sidewall spacers 412a-b are disposed over the semiconductor substrate 102 and spaced apart. An eighth dielectric structure 414 is disposed on the semiconductor substrate 102 and between the fourth pair of sidewall spacers 412a-b. A height of the eighth dielectric structure 414 may be less than the height of the second dielectric structure 122 and/or the sixth dielectric structure 214. In further embodiments, the height of the eighth dielectric structure 414 may be about the same as the height of the first dielectric structure 120. In yet further embodiments, the eighth dielectric structure 414 may be referred to as a fourth IL.

A ninth dielectric structure 416 is disposed on the eighth dielectric structure 414 and between the fourth pair of sidewall spacers 412a-b. In some embodiments, a chemical composition of the ninth dielectric structure 416 may be substantially the same as a chemical composition of the fifth dielectric structure 128. In some embodiments, a thickness of the ninth dielectric structure 416 may be the same as the fifth dielectric structure 128. In other embodiments, the thickness of the ninth dielectric structure 416 may be different (e.g., greater) than the fifth dielectric structure 128. In further embodiments, a fourth capping structure 418 is disposed on the ninth dielectric structure 416 and between the fourth pair of sidewall spacers 412a-b. A fourth conductive structure 420 is disposed on the fourth capping structure 418 and between the fourth pair of sidewall spacers 412a-b.

In some embodiments, the fourth capping structure 418 and the fourth conductive structure 420 define a fourth gate electrode 422. In further embodiments, the fourth gate electrode 422 may be referred to as a fourth metal gate electrode. In further embodiments, the eighth dielectric structure 414 and a bottom portion of the ninth dielectric structure 416 that is disposed beneath the fourth gate electrode 422 and between the fourth pair of sidewall spacers 412a-b define a fourth gate dielectric 424. The fourth gate dielectric 424 has a fourth gate dielectric capacitance. In further embodiments, the fourth gate dielectric capacitance is different than the first gate dielectric capacitance, second gate dielectric capacitance, and/or third gate dielectric capacitance. In yet further embodiments, "capacitance" in gate dielectric capacitance may refer to capacitance per unit area.

In some embodiments, the fourth region 402 may be referred to as an ultra-low voltage region. In such embodiments, the fourth semiconductor device 403 may be an ultra-low voltage semiconductor device. In further such embodiments, the fourth semiconductor device 403 may have an operating voltage that is less than an operating voltage of the first semiconductor device 103a, the second semiconductor device 103b, and/or the third semiconductor device 203.

FIGS. 5-30 illustrate a series of cross-sectional views of some embodiments of a method for forming the IC 100 of FIG. 4.

As shown in FIG. 5, a first isolation structure 106a, a second isolation structure 106b, a third isolation structure 206, and a fourth isolation structure 406 (collectively "plurality of isolation structures 106a/106b/206/406") are formed in the semiconductor substrate 102. The plurality of isolation structures 106a/106b/206/406 are formed in a first region 101a of the IC 100, a second region 101b of the IC 100, a third region 202 of the IC 100, and a fourth region 402 of the IC 100, respectively. In some embodiments, the plurality of isolation structures 106a/106b/206/406 are formed by selectively etching the semiconductor substrate 102 to form a plurality of trenches in the semiconductor substrate 102, and subsequently filling the trenches with a dielectric material. The semiconductor substrate 102 may be selectively etched by forming a masking layer (not shown) over the semiconductor substrate 102, and subsequently exposing the semiconductor substrate 102 to an etchant configured to selectively remove unmasked portions of the semiconductor substrate 102. In further embodiments, the dielectric material may comprise an oxide (e.g., silicon oxide), a nitride, a carbide, or the like. In yet further embodiments, a planarization process (e.g., chemical-mechanical polishing (CMP)) may be performed into the dielectric material to planarize uppers surfaces of the plurality of isolation structures 106a/106b/206/406.

As shown in FIG. 6, a first well 104a, a second well 104b, a third well 204, and a fourth well 404 (collectively "plurality of wells 104a/104b/204/404") are formed in the semiconductor substrate 102. The plurality of wells 104a/104b/204/404 are doped regions of the semiconductor substrate 102, respectively. In some embodiments, the plurality of wells 104a/104b/204/404 have doping types (e.g., n-type or p-type) that are opposite that of adjoining regions of the semiconductor substrate 102, or the adjoining regions of the semiconductor substrate may be intrinsic. In further embodiments, the plurality of wells 104a/104b/204/404 may be formed by one or more ion implantation processes and may utilize a masking layer (not shown) to selectively implant ions into the semiconductor substrate 102.

As shown in FIG. 7, a first sacrificial dielectric structure 702, a second sacrificial dielectric structure 704, a sixth dielectric structure 214, and a second dielectric structure 122 are formed over the semiconductor substrate 102 (collectively "first set of dielectric structures 702/704/214/122). The first sacrificial dielectric structure 702 is formed in the first region 101a, the second sacrificial dielectric structure 704 is formed in the fourth region 402, the sixth dielectric structure 214 is formed in the third region 202, and the second dielectric structure 122 is formed in the second region 101b. Further, a plurality of sacrificial gates 706a-d are formed over the semiconductor substrate 102. For example, a first sacrificial gate 706a is formed on the first sacrificial dielectric structure 702, a second sacrificial gate 706b is formed on the second sacrificial dielectric structure 704, a third sacrificial gate 706c is formed on the sixth dielectric structure 214, and a fourth sacrificial gate 706d is formed on the second dielectric structure 122.

In some embodiments, a process for forming the plurality of sacrificial gates 706a-d and the first set of dielectric structures 702/704/214/122 comprises depositing or growing a dielectric layer (not shown) on the semiconductor substrate 102. In some embodiments, the dielectric layer is an oxide layer (e.g., $SiO_2$). In further embodiments, the dielectric layer may be deposited or grown by thermal oxidation, chemical vapor deposition (CVD), physical vapor deposition (PVD), atomic layer deposition (ALD), sputtering, or some other deposition or growth process.

Thereafter, a processing layer (not shown) is formed on the dielectric layer. In some embodiments, the processing layer may be, for example, polysilicon. In some embodiments, the processing layer may be formed by, for example, CVD, PVD, ALD, sputtering, or some other deposition process. After the processing layer is formed on the dielectric layer, the processing layer and the dielectric layer are patterned.

In some embodiments, a process for patterning the processing layer and the dielectric layer comprises forming a masking layer (not shown) on the processing layer. The masking layer may be formed by depositing (e.g., via a spin on process) a photoresist material (e.g., positive/negative photoresist) on the processing layer and then patterning the photoresist material using photolithography. In further embodiments, the process comprises performing an etch into the processing layer and the dielectric layer with the masking layer in place to remove unmasked portions of the processing layer and dielectric layer. Accordingly, the first sacrificial gate 706a is formed on the first sacrificial dielectric structure 702, the second sacrificial gate 706b is formed on the second sacrificial dielectric structure 704, the third sacrificial gate 706c is formed on the sixth dielectric structure 214, and the fourth sacrificial gate 706d is formed on the second dielectric structure 122. In yet further embodiments, the masking layer may be subsequently stripped away.

As shown in FIG. 8, a first pair of lightly-doped source/drain extensions 112a-b, a second pair of lightly-doped source/drain extensions 114a-b, a third pair of lightly-doped source/drain extensions 210a-b, and a fourth pair of lightly-doped source/drain extensions 410a-b are formed in the semiconductor substrate 102 (collectively "plurality of lightly-doped source/drain extensions 112a-b/114a-b/210a-b/410a-b"). The plurality of lightly-doped source/drain extensions 112a-b/114a-b/210a-b/410a-b are formed in the first region 101a, the second region 101b, the third region 202, and the fourth region 402, respectively. In some embodiments, the plurality of lightly-doped source/drain extensions 112a-b/114a-b/210a-b/410a-b are formed by one or more ion implantation processes and may utilize a masking layer (not shown) to selectively implant ions into the semiconductor substrate 102. In further embodiments, the first set of dielectric structures 702/704/214/122 may be utilized as the masking layer.

As shown in FIG. 9, a first pair of sidewall spacers 116a-b, a second pair of sidewall spacers 118a-b, a third pair of sidewall spacers 212a-b, and a fourth pair of sidewall spacers 412a-b (collectively "plurality of sidewall spacers 116a-b/118a-b/212a-b/412a-b") are formed over the semiconductor substrate 102. The first pair of sidewall spacers 116a-b are formed along sides of the first sacrificial dielectric structure 702 and sides of the first sacrificial gate 706a. The second pair of sidewall spacers 118a-b are formed along sides of the second dielectric structure 122 and sides of the fourth sacrificial gate 706d. The third pair of sidewall spacers 212a-b are formed along sides of the sixth dielectric structure 214 and sides of the third sacrificial gate 706c. The fourth pair of sidewall spacers 412a-b are formed along sides of the second sacrificial dielectric structure 704 and sides of the second sacrificial gate 706b.

In some embodiments, the plurality of sidewall spacers 116a-b/118a-b/212a-b/412a-b may be formed by depositing a spacer layer over the semiconductor substrate 102, the plurality of isolation structures 106a/106b/206/406, and the plurality of sacrificial gates 706a-d. The spacer layer may be deposited by, for example, PVD, CVD, ALD, sputtering, or some other deposition process. In further embodiments, the spacer layer is subsequently etched to remove the spacer layer from horizontal surfaces, thereby forming the plurality of sidewall spacers 116a-b/118a-b/212a-b/412a-b. The spacer layer may comprise, for example, an oxide (e.g., $SiO_2$), a nitride (e.g., SiN), an oxy-nitride (e.g., $SiO_XN_Y$), some other dielectric material, or a combination of the foregoing. In some embodiments, the plurality of sidewall spacers 116a-b/118a-b/212a-b/412a-b may be formed prior to forming the plurality of lightly-doped source/drain extensions 112a-b/114a-b/210a-b/410a-b. In such embodiments, the plurality of lightly-doped source/drain extensions 112a-b/114a-b/210a-b/410a-b may be formed using one or more angled ion implantation processes.

As shown in FIG. 10, a first pair of source/drain regions 108a-b, a second pair of source/drain regions 110a-b, a third pair of source/drain regions 208a-b, and a fourth pair of source/drain regions 408a-b (collectively "plurality of source/drain regions 108a-b/110a-b/208a-b/408a-b") are formed in the semiconductor substrate 102. The plurality of source/drain regions 108a-b/110a-b/208a-b/408a-b are formed in the first region 101a, the second region 101b, the third region 202, and the fourth region 402, respectively. In some embodiments, the plurality of source/drain regions 108a-b/110a-b/208a-b/408a-b are formed by one or more ion implantation processes and may utilize a masking layer (not shown) to selectively implant ions into the semiconductor substrate 102. In further embodiments, the plurality of sidewall spacers 116a-b/118a-b/212a-b/412a-b and the first set of dielectric structures 702/704/214/122 may be utilized as the masking layer.

Figure 11:
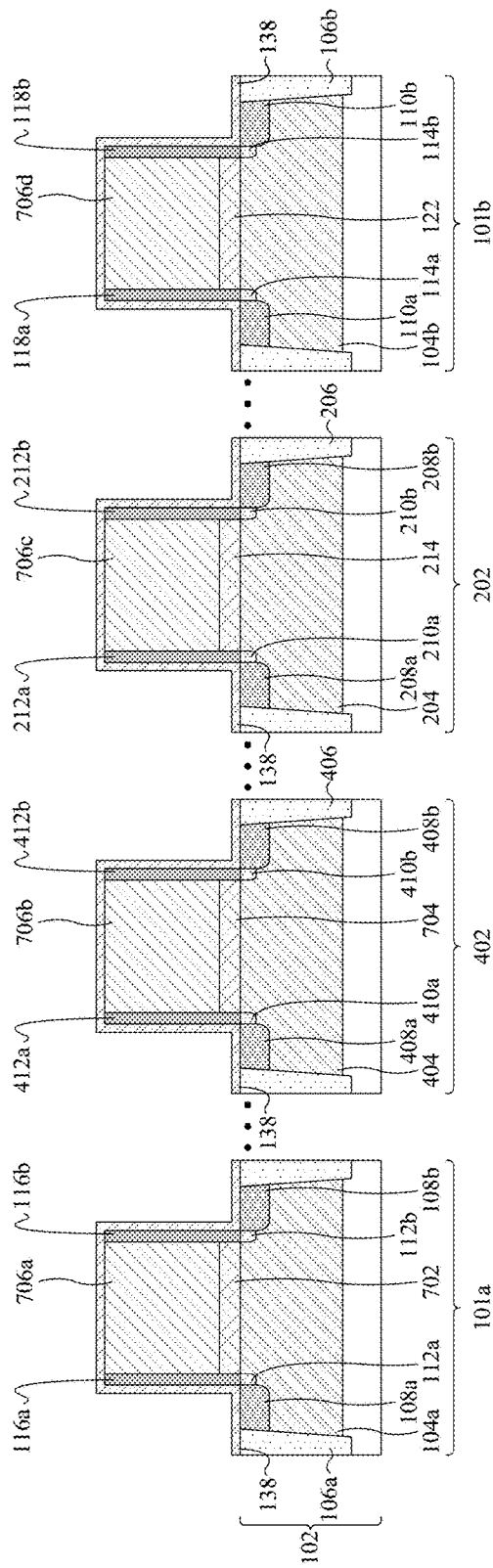

As shown in FIG. 11, a contact etch stop layer (CESL) 138 is formed on the plurality of isolation structures 106a/106b/206/406, the plurality of source/drain regions 108a-b/110a-b/208a-b/408a-b, the plurality of sidewall spacers 116a-b/118a-b/212a-b/412a-b, and the plurality of sacrificial gates 706a-d. In some embodiments, the CESL 138 may comprise, for example, an oxide (e.g., $SiO_2$), a nitride (e.g., SiN), an oxy-nitride (e.g., $SiO_XN_Y$), some other dielectric material, or a combination of the foregoing. In further embodiments, a process for forming the CESL 138 comprises depositing the CESL 138 by, for example, CVD, PVD, ALD, sputtering, or some other deposition process.

Figure 12:
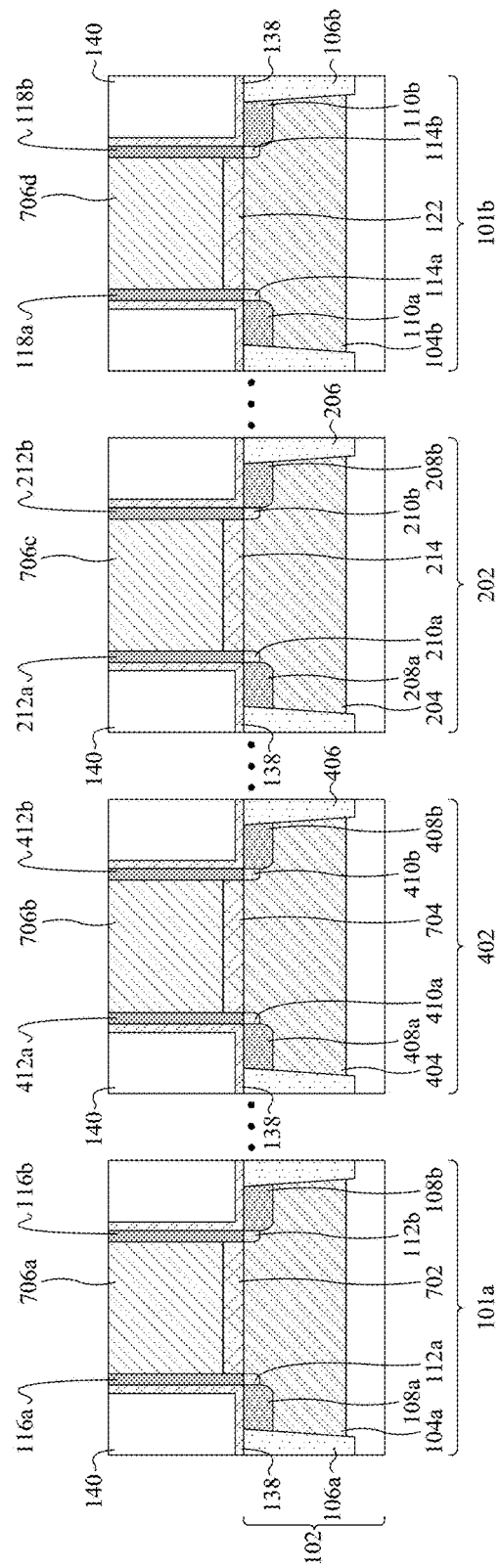

As shown in FIG. 12, a first interlayer dielectric (ILD) layer 140 is formed over the semiconductor substrate 102 and on the CESL 138. In some embodiments, a process for forming the first ILD layer 140 comprises depositing the first ILD layer 140 on the CESL 138 and extending over the plurality of sacrificial gates 706a-d. The first ILD layer 140 may be deposited by, for example, CVD, PVD, ALD, sputtering, or some other deposition process. Thereafter, a planarization process (e.g., CMP) is performed into the first ILD layer 140 and the CESL 138 to remove upper portions of the first ILD layer 140 and the CESL 138. Thus, the first ILD layer 140 may have upper surfaces that are substantially co-planar with upper surfaces of the CESL 138, the plurality of sidewall spacers 116a-b/118a-b/212a-b/412a-b, and/or the plurality of sacrificial gates 706a-d.

Figure 13:
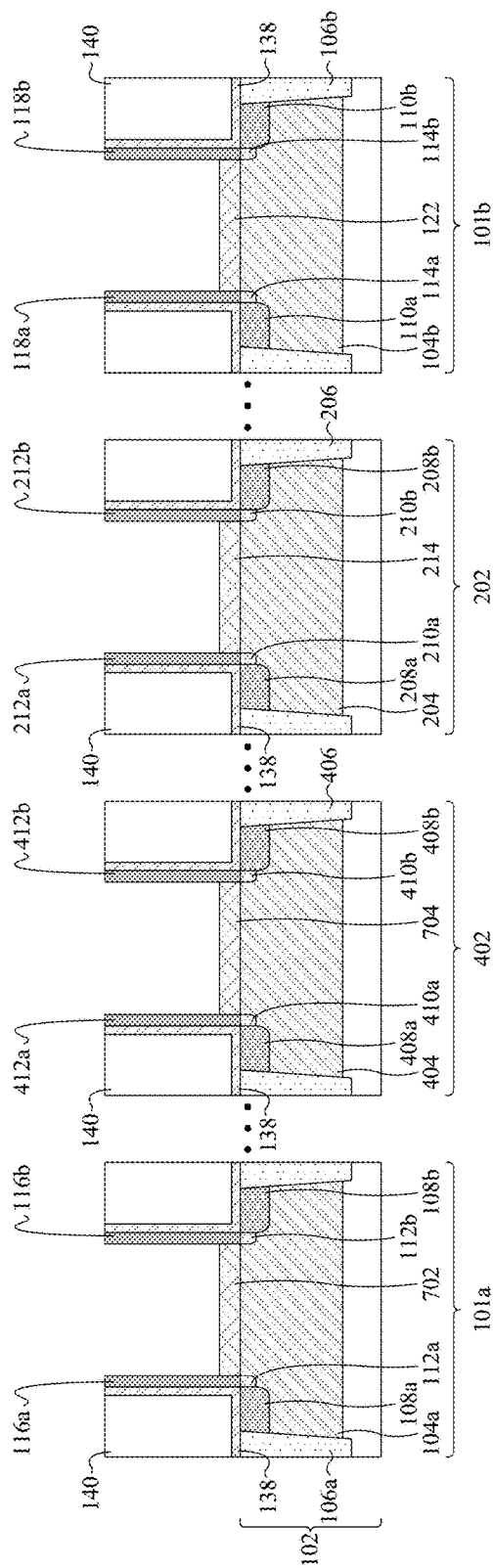

As shown in FIG. 13, the plurality of sacrificial gates 706a-d are removed. In some embodiments, a process for removing the plurality of sacrificial gates 706a-d comprises performing a first etch (e.g., dry or wet etch) that selectively removes the plurality of sacrificial gates 706a-d. In further embodiments, before the first etch, a masking layer (not shown) may be formed covering the first ILD layer 140, the CESL 138, and the plurality of sidewall spacers 116a-b/118a-b/212a-b/412a-b, while leaving the plurality of sacrificial gates 706a-d unmasked. In such embodiments, the first etch is performed with the masking layer in place, thereby removing the plurality of sacrificial gates 706a-d. Subsequently, the masking layer may be stripped away.

Figure 14:
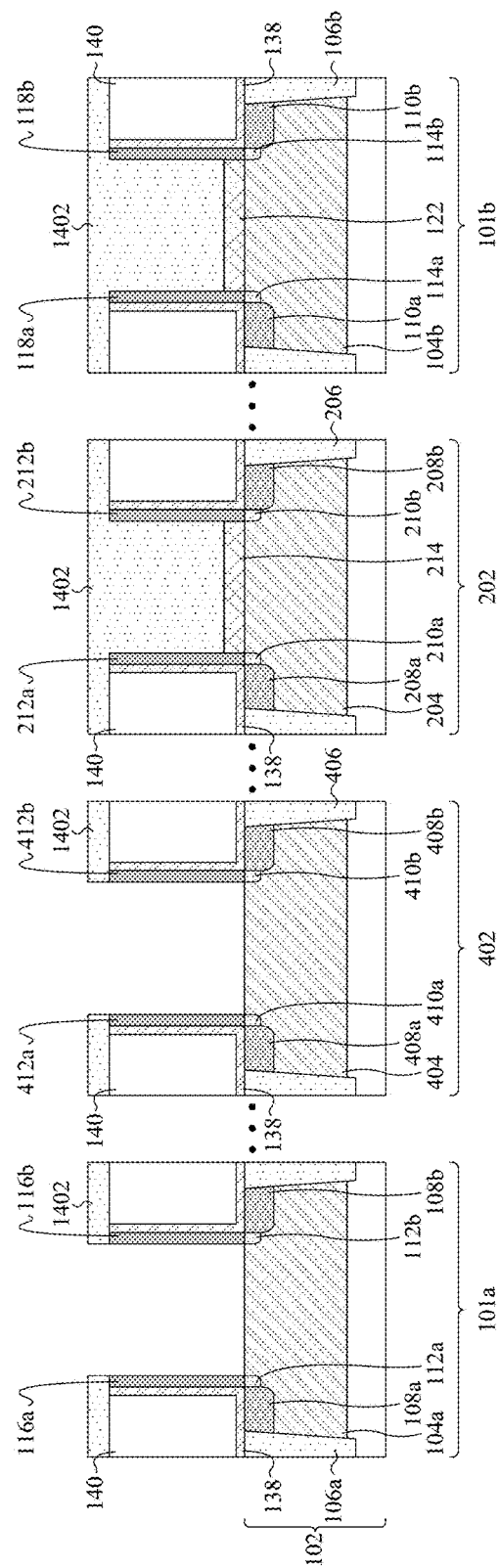

As shown in FIG. 14, the first sacrificial dielectric structure 702 and the second sacrificial dielectric structure 704 are removed from the semiconductor substrate 102. In some embodiments, a process for removing the first sacrificial dielectric structure 702 and the second sacrificial dielectric structure 704 comprises forming a first masking layer 1402 (e.g., negative/positive photoresist) that covers the first ILD layer 140, the CESL 138, the plurality of sidewall spacers 116a-b/118a-b/212a-b/412a-b, the sixth dielectric structure 214, and the second dielectric structure 122. Thereafter, a second etch (e.g., wet/dry etch) is performed with the first masking layer 1402 in place, such that the first sacrificial dielectric structure 702 and the second sacrificial dielectric structure 704 are removed from the semiconductor substrate 102. Subsequently, the first masking layer 1402 may be stripped away.

As shown in FIG. 15, a first dielectric structure 120 is formed over the semiconductor substrate 102 and between the first pair of sidewall spacers 116a-b. Further, an eighth dielectric structure 414 is formed over the semiconductor substrate 102 and between the fourth pair of sidewall spacers 412a-b. In some embodiments, the first dielectric structure 120, the eighth dielectric structure 414, the sixth dielectric structure 214, and the second dielectric structure 122 are collectively referred to as a "second set of dielectric structures 120/414/214/122." In further embodiments, the second set of dielectric structures 120/414/214/122 and the plurality of sidewall spacers 116a-b/118a-b/212a-b/412a-b define a plurality of openings 1502a-d. For example, an upper surface of the first dielectric structure 120 and inner sidewalls of the first pair of sidewall spacers 116a-b define a first opening 1502a; an upper surface of the eighth dielectric structure 414 and inner sidewalls of the fourth pair of sidewall spacers 412a-b define a second opening 1502b; an upper surface of the sixth dielectric structure 214 and inner sidewalls of the third pair of sidewall spacers 212a-b define a third opening 1502c; and an upper surface of the second dielectric structure 122 and inner sidewalls of the second pair of sidewall spacers 118a-b define a fourth opening 1502d.

In some embodiments, a process for forming the first dielectric structure 120 and the eighth dielectric structure 414 comprises selectively depositing or growing the first dielectric structure 120 and the eighth dielectric structure 414 on the semiconductor substrate 102. In further embodiments, the first dielectric structure 120 and the eighth dielectric structure 414 may be deposited or grown by, for example, thermal oxidation, CVD, PVD, ALD, sputtering, or some other deposition or growth process. It will be appreciated that, in some embodiments, a masking layer may not be utilized to selectively form the first dielectric structure 120 and the eighth dielectric structure 414 on the semiconductor substrate 102.

As shown in FIG. 16, a first dielectric layer 1602 is formed over the semiconductor substrate 102 and in the first region 101a, the second region 101b, the third region 202, and the fourth region 402 (collectively "plurality of regions 101a/101b/202/402"). In some embodiments, the first dielectric layer 1602 is formed on the first ILD layer 140, the CESL 138, the plurality of sidewall spacers 116a-b/118a-b/212a-b/412a-b, and the second set of dielectric structures 120/414/214/122. In further embodiments, the first dielectric layer 1602 may be formed as a conformal layer. In yet further embodiments, the first dielectric layer 1602 may be referred to as a first high-k dielectric layer.

In some embodiments, the first dielectric layer 1602 may have a thickness that is less than or equal to about 1 nm. More specifically, the thickness of the first dielectric layer 1602 may be less than or equal to about 50 angstrom. In further embodiments, the first dielectric layer 1602 may be formed by, for example, CVD, PVD, ALD, sputtering, or some other deposition process. In yet further embodiments, the first dielectric layer 1602 may comprise, for example, hafnium zirconium oxide ($Hf_xZr_yO_2$), a hafnium based oxide (e.g., $HfO_2$), a zirconium based oxide (e.g., $ZrO_2$), some other dielectric material having a dielectric constant greater than about 3.9, or a combination of the foregoing.

As shown in FIG. 17, a first portion of the first dielectric layer 1602 is removed from the fourth region 402. In some embodiments, a process for removing the first portion of the first dielectric layer 1602 comprises forming a second masking layer 1702 (e.g., negative/positive photoresist) over the first dielectric layer 1602. The second masking layer 1702 is formed covering the first dielectric layer 1602 in the first region 101a, the first dielectric layer 1602 in the second region 101b, and the first dielectric layer 1602 in the third region 202. Thereafter, a third etch is performed with the second masking layer 1702 in place, such that the first portion of the first dielectric layer 1602 is removed from the fourth region 402.

In some embodiments, the third etch may be an atomic layer etch (ALE) (e.g., plasma/thermal ALE). In further embodiments, the chemical compounds utilized in the third etch may be, for example, hydrogen fluoride (HF), ammonia ($NH_3$), dinitrogen ($N_2$), or the like. The third etch may reduce the thickness of the first dielectric layer 1602 linearly over time. For example, the third etch may remove an amount of the first dielectric layer 1602 based on the following equation: $y=0.2159x-0.3243$, where y is an amount the third etch removes of the first dielectric layer 1602 in nanometers and x is an etching time in seconds.

As shown in FIG. 18, a thickness of the first dielectric layer 1602 is reduced in the second region 101b, thereby forming a second dielectric layer 1802 in the second region 101b. In some embodiments, a process for forming the second dielectric layer 1802 comprises removing a portion of the second masking layer 1702 from the second region 101b. Thereafter, a fourth etch is performed, such that the thickness of the first dielectric layer 1602 is reduced in the second region 101b. It will be appreciated that, in some embodiments, the fourth region 402 may be covered by a masking layer (not shown) during the fourth etch.

In some embodiments, the fourth etch may be an ALE. In further embodiments, the chemical compounds utilized in the fourth etch may be, for example, hydrogen fluoride (HF), ammonia ($NH_3$), dinitrogen ($N_2$), or the like. The fourth etch may reduce the thickness of the first dielectric layer 1602 linearly over time. In yet further embodiments, the fourth etch may be substantially the same as the third etch (e.g., substantially similar chemical compounds, substantially similar removal rate, etc.). In such embodiments, an etching time of the fourth etch is less than an etching time of the third etch.

In some embodiments, the etching time of the fourth etch may be varied to selectively tune a thickness of the second dielectric layer 1802. For example, by increasing the etching time of the fourth etch, the thickness of the first dielectric layer 1602 may be reduced linearly until the first dielectric layer 1602 is removed entirely from the second region 101*b* (see, e.g., FIGS. 3A-3D for different embodiments of selectively tuned thicknesses). It will be appreciated that, in some embodiments, the fourth etch may be an ALE, and the third etch may be a different type of etch (e.g., reactive-ion etching (RIE), buffered oxide etch (BOE), etc.) than the ALE.

Figure 19:
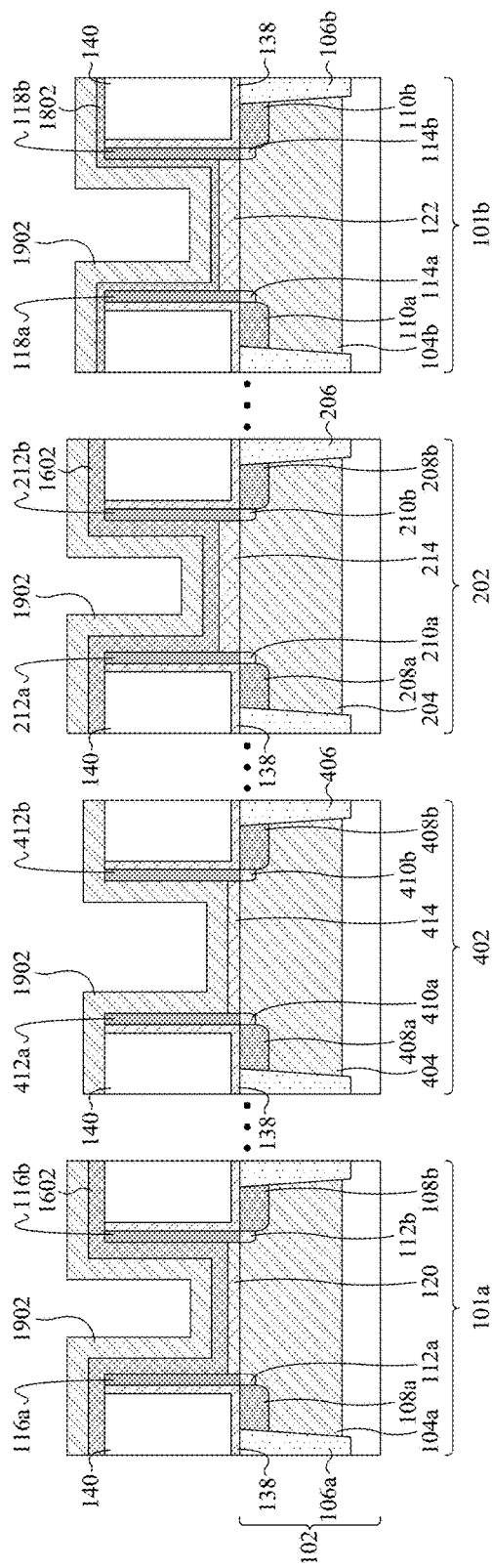

As shown in FIG. 19, a third dielectric layer 1902 is formed over the semiconductor substrate 102 and in the plurality of regions 101*a*/101*b*/202/402. In some embodiments, the third dielectric layer 1902 is formed on the first dielectric layer 1602; the second dielectric layer 1802; the fourth pair of sidewall spacers 412*a-b*, the CESL 138 in the fourth region 402, and the first ILD layer 140 in the fourth region 402. In further embodiments, the third dielectric layer 1902 may be formed as a conformal layer. In yet further embodiments, the third dielectric layer 1902 may be referred to as a second high-k dielectric layer.

In some embodiments, the third dielectric layer 1902 may have a thickness that is less than or equal to about 1 nm. More specifically, the thickness of the third dielectric layer 1902 may be less than or equal to about 50 angstrom. The third dielectric layer 1902 may be formed by, for example, CVD, PVD, ALD, sputtering, or some other deposition process. In further embodiments, the third dielectric layer 1902 may comprise, for example, hafnium zirconium oxide ($Hf_xZr_yO_2$), a hafnium based oxide (e.g., $HfO_2$), a zirconium based oxide (e.g., $ZrO_2$), some other dielectric material having a dielectric constant greater than about 3.9, or a combination of the foregoing. In yet further embodiments, the third dielectric layer 1902 may have a different chemical composition and/or thickness than the first dielectric layer 1602. In other embodiments, the chemical composition and/or thickness of the third dielectric layer 1902 may be substantially the same as the first dielectric layer 1602.

Figure 20:
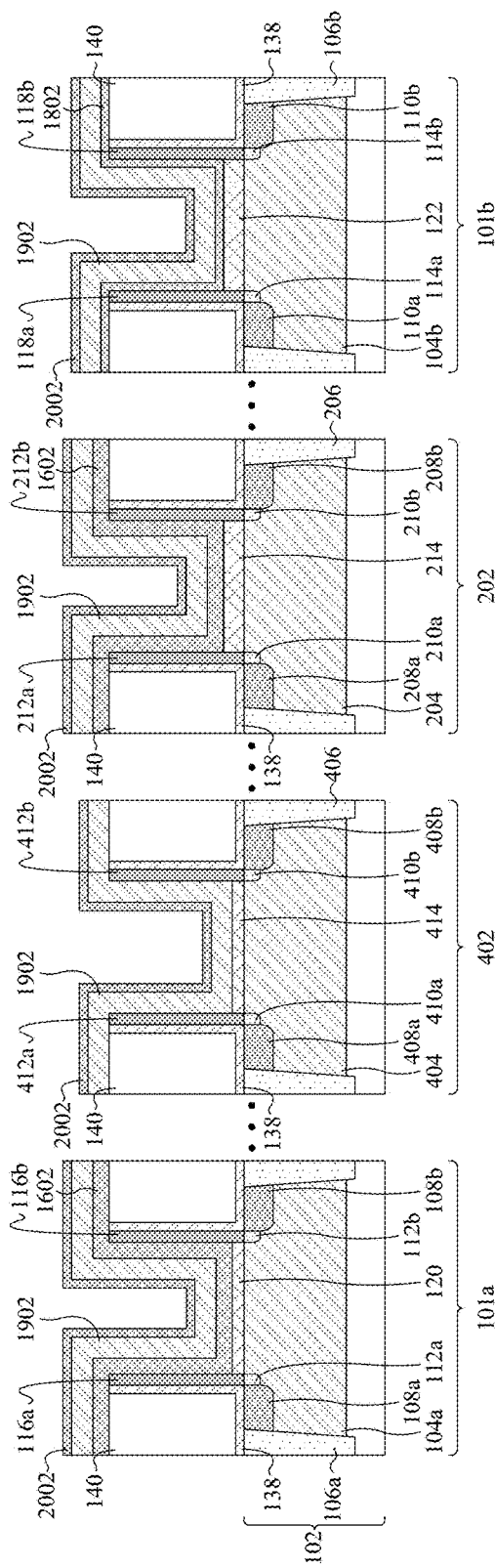

As shown in FIG. 20, a metal layer 2002 is formed in the plurality of regions 101*a*/101*b*/202/402 and on the third dielectric layer 1902. In some embodiments, the metal layer 2002 may comprise, for example, titanium (Ti), tantalum (Ta), or the like. In further embodiments, a process for forming the metal layer 2002 comprises depositing the metal layer 2002 by, for example, CVD, PVD, ALD, sputtering, electrochemical plating, electroless plating, or some other deposition process. In yet further embodiments, after the metal layer 2002 is formed, a thermal treatment (e.g., anneal) may be performed on the metal layer 2002 (e.g., to improve gate leakage).

Figure 21:
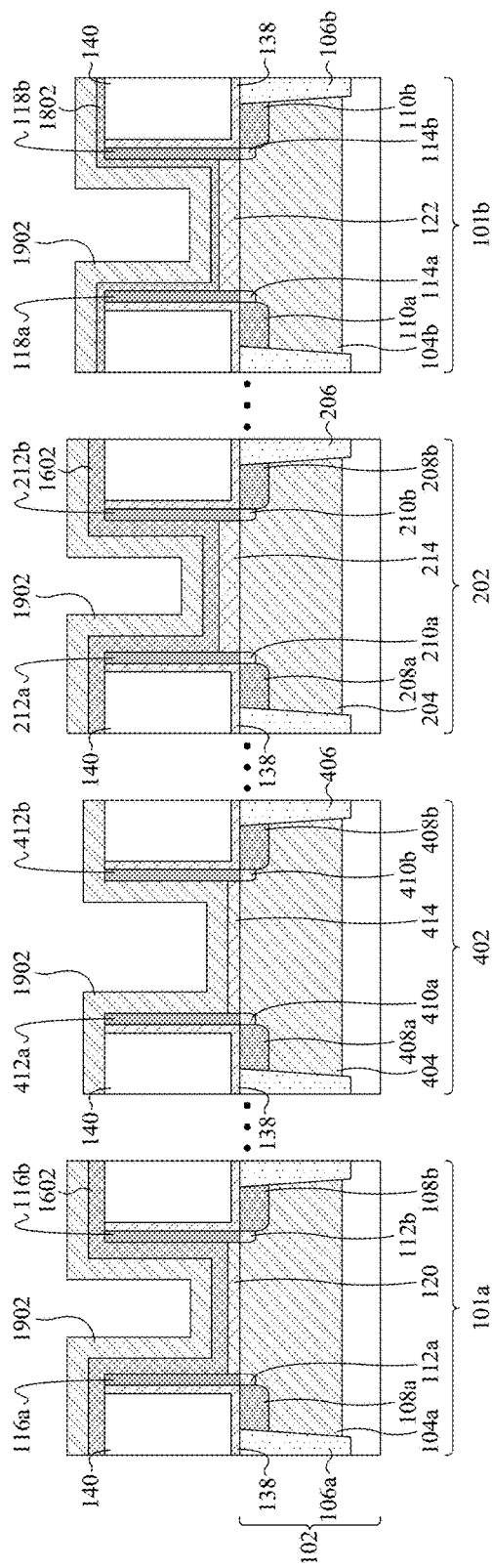

As shown in FIG. 21, the metal layer 2002 is removed from the third dielectric layer 1902. In some embodiments, a process for removing the metal layer 2002 comprises performing a fifth etch (e.g., wet/dry etch) on the metal layer 2002. In other embodiments, the metal layer 2002 may not be removed.

Figure 22:
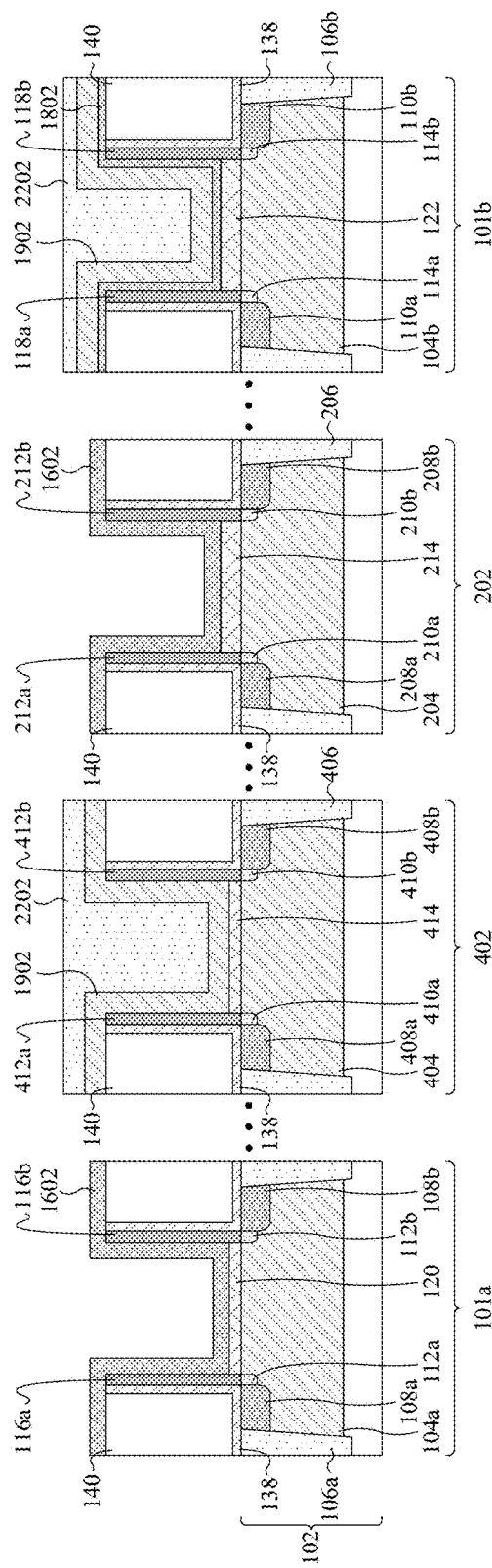

As shown in FIG. 22, a first portion of the third dielectric layer 1902 is removed from the first region 101*a*, and a second portion of the third dielectric layer 1902 is removed from the third region 202. In some embodiments, a process for removing the first portion and the second portion of the third dielectric layer 1902 comprises forming a third masking layer 2202 (e.g., negative/positive photoresist) over the third dielectric layer 1902. In further embodiments, the third masking layer 2202 is formed covering the third dielectric layer 1902 in the second region 101*b* and covering the third dielectric layer 1902 in the fourth region 402. Thereafter, a sixth etch is performed with the third masking layer 2202 in place, such that the first portion and the second portion of the third dielectric layer 1902 are removed from the first region 101*a* and the third region 202, respectively.

In some embodiments, the sixth etch may be an ALE. In further embodiments, the chemical compounds utilized in the sixth etch may be, for example, hydrogen fluoride (HF), ammonia ($NH_3$), dinitrogen ($N_2$), or the like. The sixth etch may reduce the thickness of the third dielectric layer 1902 linearly over time. In yet further embodiments, the rate in which the sixth etch reduces the thickness of the third dielectric layer 1902 may be different than the rate in which the third etch reduces the thickness of the first dielectric layer 1602. In other embodiments, the rate in which the sixth etch reduces the thickness of the third dielectric layer 1902 may be substantially the same as the rate in which the third etch reduces the thickness of the first dielectric layer 1602.

Figure 23:
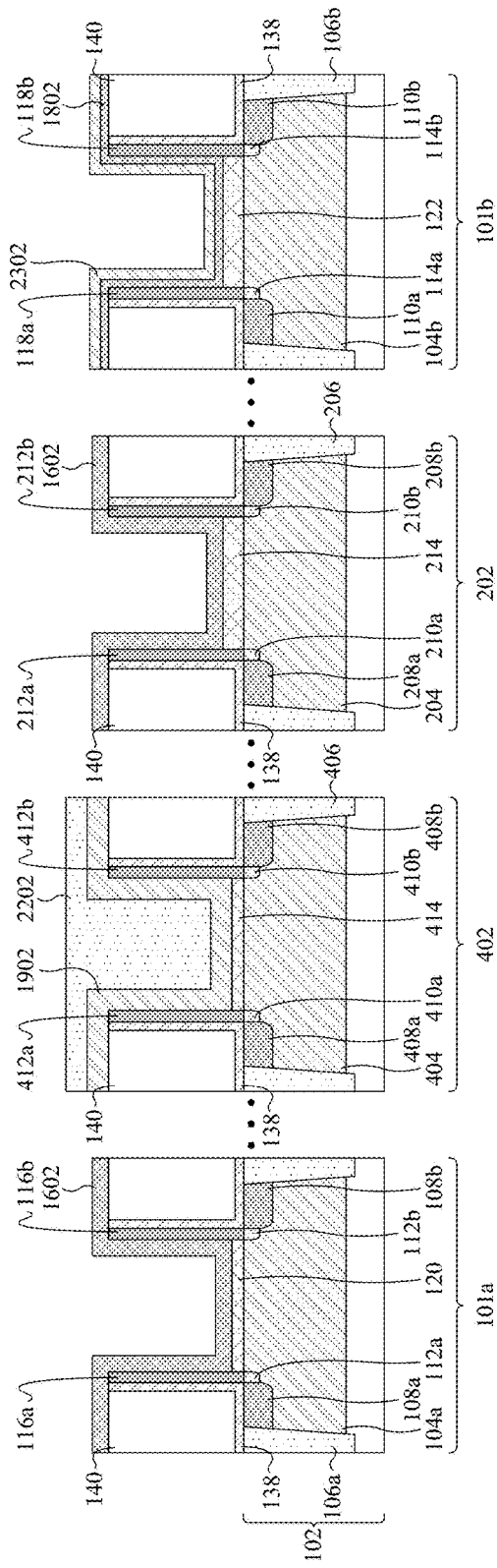

As shown in FIG. 23, a thickness of the third dielectric layer 1902 is reduced in the second region 101*b*, thereby forming a fourth dielectric layer 2302 in the second region 101*b*. In some embodiments, a process for forming the fourth dielectric layer 2302 comprises removing a portion of the third masking layer 2202 from the second region 101*b*. Thereafter, a seventh etch is performed, such that the thickness of the third dielectric layer 1902 is reduced in the second region 101*b*. It will be appreciated that, in some embodiments, the fourth region 402 may be covered by a masking layer (not shown) during the seventh etch.

In some embodiments, the seventh etch may be an ALE. In further embodiments, the chemical compounds utilized in the seventh etch may be, for example, hydrogen fluoride (HF), ammonia ($NH_3$), dinitrogen ($N_2$), or the like. The seventh etch may reduce the thickness of the third dielectric layer 1902 linearly over time. In yet further embodiments, the seventh etch may be substantially the same as the sixth etch (e.g., substantially similar chemical compounds, substantially similar removal rate, etc.). In such embodiments, an etching time of the seventh etch is less than an etching time of the sixth etch.

In some embodiments, the etching time of the seventh etch may be varied to selectively tune a thickness of the fourth dielectric layer 2302. For example, by increasing the etching time of the seventh etch, the thickness of the third dielectric layer 1902 may be reduced linearly until the third dielectric layer 1902 is removed entirely from the second region 101*b* (see, e.g., FIGS. 3A-3D for different embodiments of selectively tuned thicknesses). It will be appreciated that, in some embodiments, the seventh etch may be an ALE, and the sixth etch may be a different type of etch (e.g., reactive-ion etching (RIE), buffered oxide etch (BOE), etc.) than the ALE.

Figure 24:
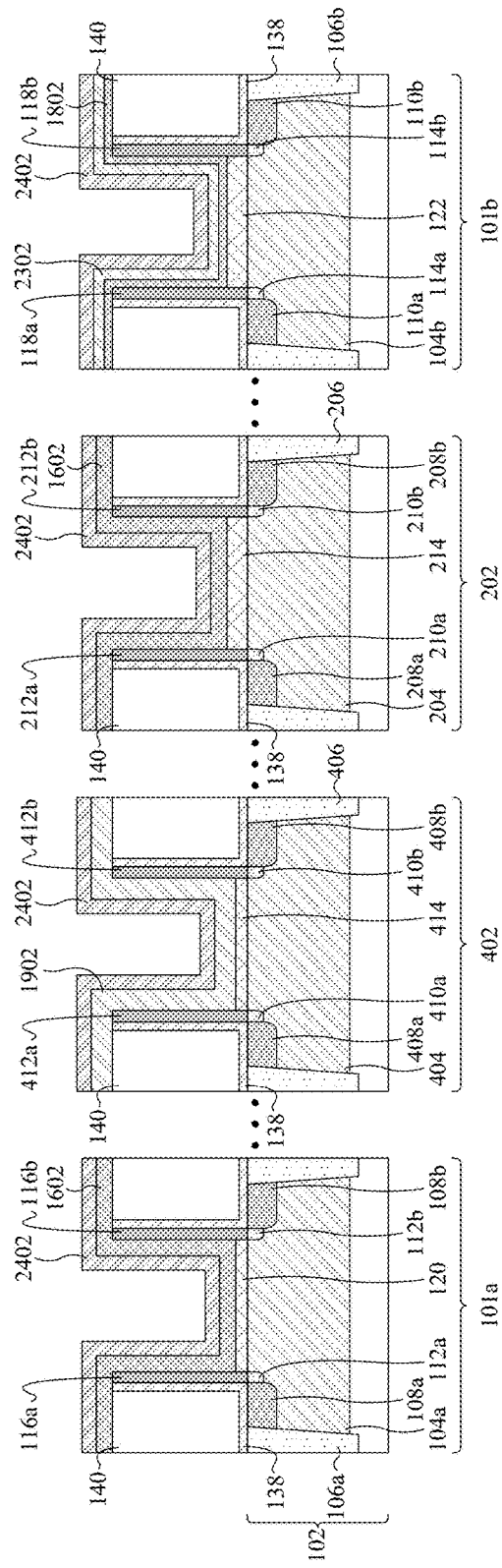

As shown in FIG. 24, a capping layer 2402 is formed on the first dielectric layer 1602, the third dielectric layer 1902, and the fourth dielectric layer 2302. In some embodiments, the capping layer 2402 comprises, for example, titanium nitride (TiN), tantalum nitride (TaN), or the like. In further embodiments, the capping layer 2402 may be formed as a conformal layer. In yet further embodiments, a process for forming the capping layer 2402 comprises depositing the capping layer 2402 by, for example, CVD, PVD, ALD, sputtering, electrochemical plating, electroless plating, or some other deposition process.

Figure 25:
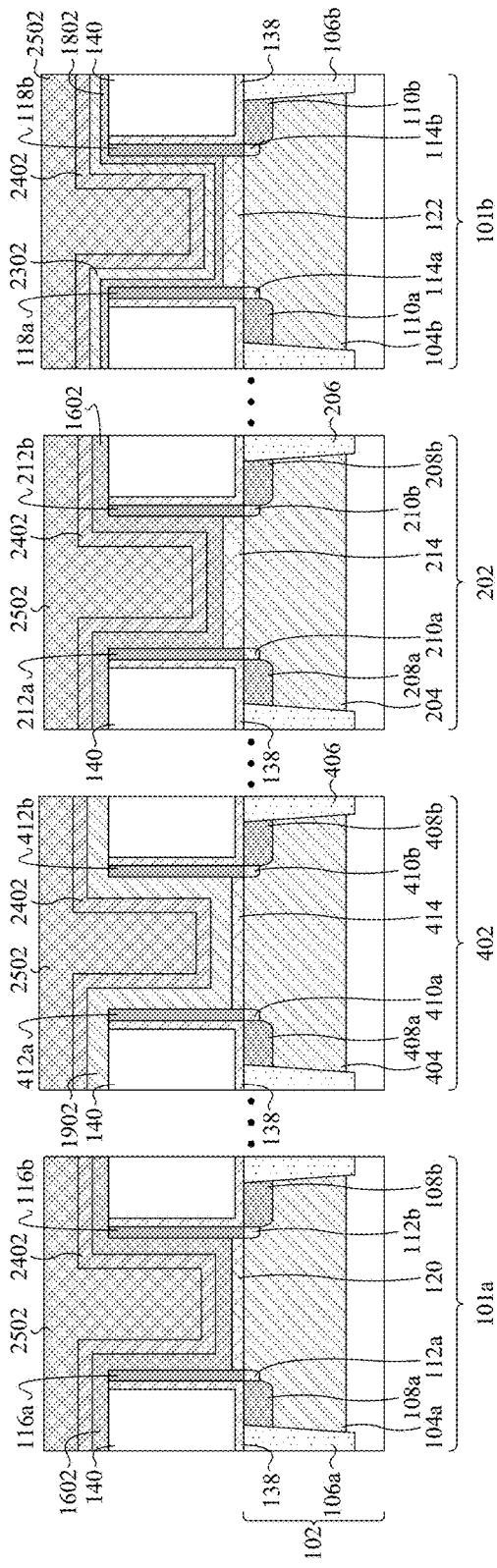

As shown in FIG. 25, a conductive layer 2502 is formed on the capping layer 2402. The conductive layer 2502 may comprise, for example, tungsten, titanium, aluminum, or the like. In some embodiments, the conductive layer 2502 is formed with a substantially planar upper surface. In further embodiments, a process for forming the conductive layer 2502 comprises depositing the conductive layer 2502 by, for example, CVD, PVD, ALD, sputtering, electrochemical plating, electroless plating, or some other deposition process. In yet further embodiments, the conductive layer 2502 may be referred to as a second metal layer.

Figure 26:
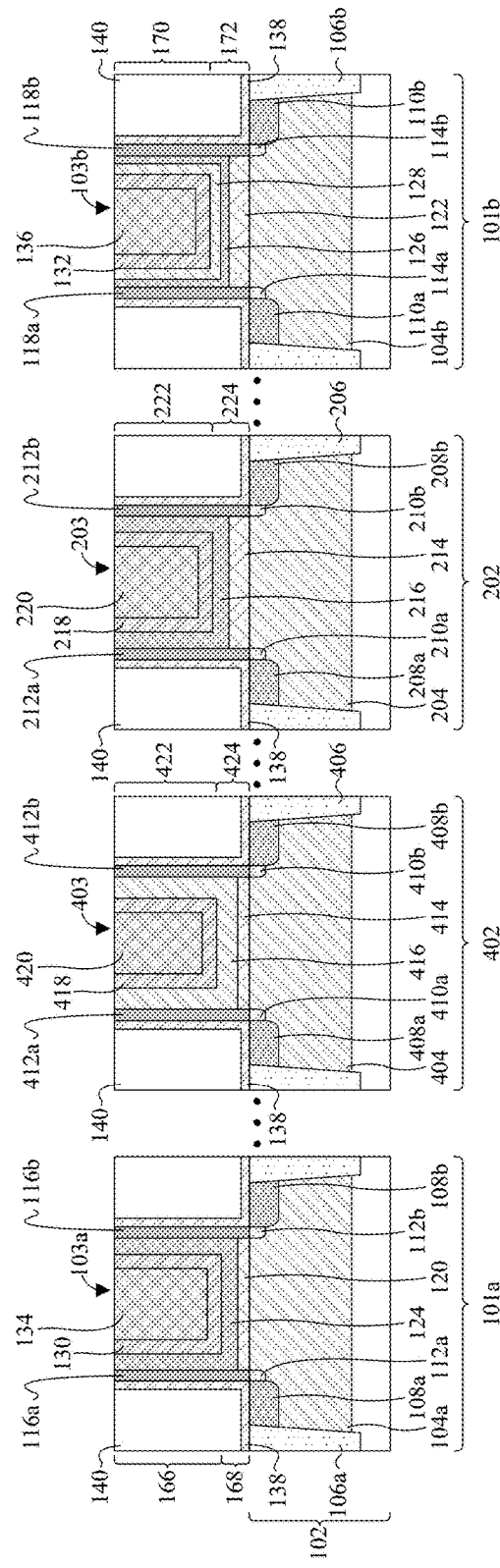

As shown in FIG. 26, a first semiconductor device 103a, a second semiconductor device 103b, a third semiconductor device 203, and a fourth semiconductor device 403 (collectively "plurality of semiconductor devices 103a/103b/203/403") are formed in the plurality of regions 101a/101b/202/402, respectively. In some embodiments, a process for forming the plurality of semiconductor devices 103a/103b/203/403 comprises performing a planarization process (e.g., CMP) into the conductive layer 2502, the capping layer 2402, the first dielectric layer 1602, the third dielectric layer 1902, the fourth dielectric layer 2302, and the second dielectric layer 1802.

The planarization process removes upper portions of the conductive layer 2502, the capping layer 2402, the first dielectric layer 1602, the third dielectric layer 1902, the fourth dielectric layer 2302, and the second dielectric layer 1802. Accordingly, the planarization process forms a third dielectric structure 124, a first capping structure 130, and a first conductive structure 134 in the first region 101a; a fourth dielectric structure 126, a fifth dielectric structure 128, a second capping structure 132, and a second conductive structure 136 in the second region 101b; a seventh dielectric structure 216, a third capping structure 218, and a third conductive structure 220 in the third region 202; and a ninth dielectric structure 416, a fourth capping structure 418, and a fourth conductive structure 420 in the fourth region 402. In some embodiments, the planarization process may co-planarize upper surfaces of the first ILD layer 140, the CESL 138, the plurality of sidewall spacers 116a-b/118a-b/212a-b/412a-b, the third dielectric structure 124, the first capping structure 130, the first conductive structure 134, the fourth dielectric structure 126, the fifth dielectric structure 128, the second capping structure 132, the second conductive structure 136, the seventh dielectric structure 216, the third capping structure 218, the third conductive structure 220, the ninth dielectric structure 416, the fourth capping structure 418, and the fourth conductive structure 420.

Figure 27:
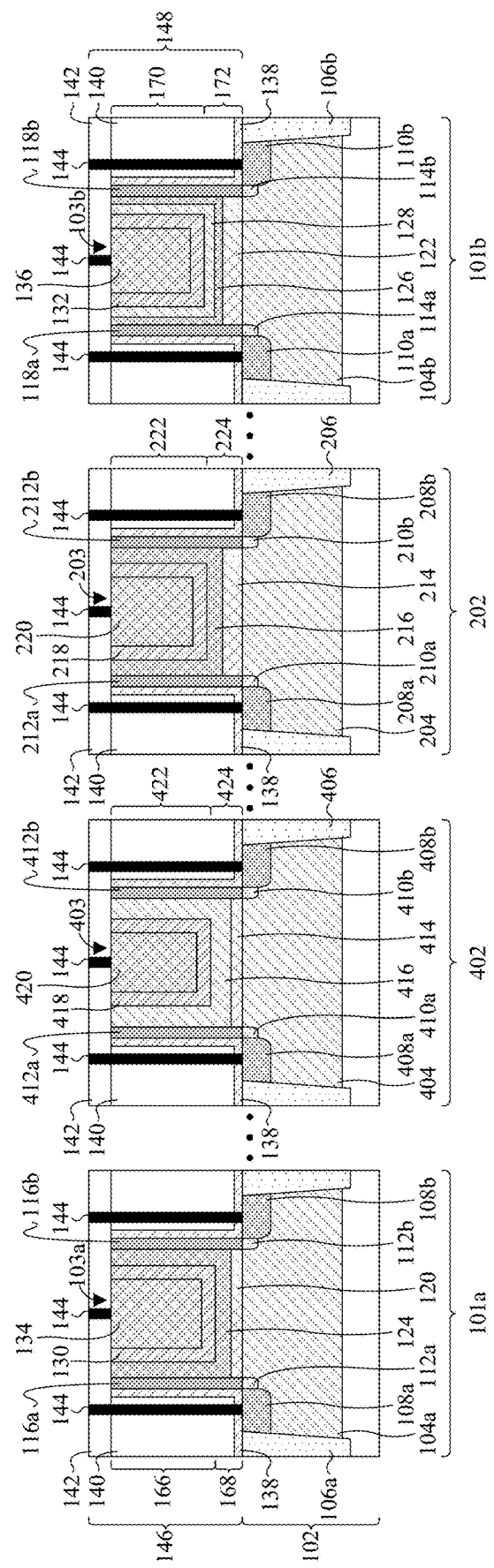

As shown in FIG. 27, a second ILD layer 142 is formed over the plurality of semiconductor devices 103a/103b/203/403, the CESL 138, and the first ILD layer 140. In some embodiments, a process for forming the second ILD layer 142 comprises depositing the second ILD layer 142 on the first ILD layer 140, the CESL 138, and the plurality of semiconductor devices 103a/103b/203/403. In further embodiments, the second ILD layer 142 may be deposited by, for example, CVD, PVD, ALD, sputtering, or some other deposition process.

Also shown in FIG. 27, a plurality of conductive contacts 144 are formed in the second ILD layer 142 and the first ILD layer 140. In some embodiments, a process for forming the plurality of conductive contacts 144 comprises performing an etch into the second ILD layer 142 and the first ILD layer 140 to form contact openings that correspond to the plurality of conductive contacts 144. The etch may be performed with a masking layer (not shown) formed over the second ILD layer 142. In further embodiments, the process comprises filling the contact openings with a conductive material (e.g., tungsten). The contact openings may be filled by depositing a conductive layer (not shown) covering the second ILD layer 142 and filling the contact openings. Subsequently, a planarization process (e.g., CMP) is performed into the conductive layer and the second ILD layer 142, thereby forming the plurality of conductive contacts 144 in the second ILD layer 142. In further embodiments, the conductive layer may be deposited by, for example, CVD, PVD, ALD, sputtering, electrochemical plating, electroless plating, or some other deposition process. In yet further embodiments, formation of a lower portion 146 of an interconnect structure 148 may be complete once the second ILD layer 142 and the plurality of conductive contacts 144 have been formed.

Figure 28:
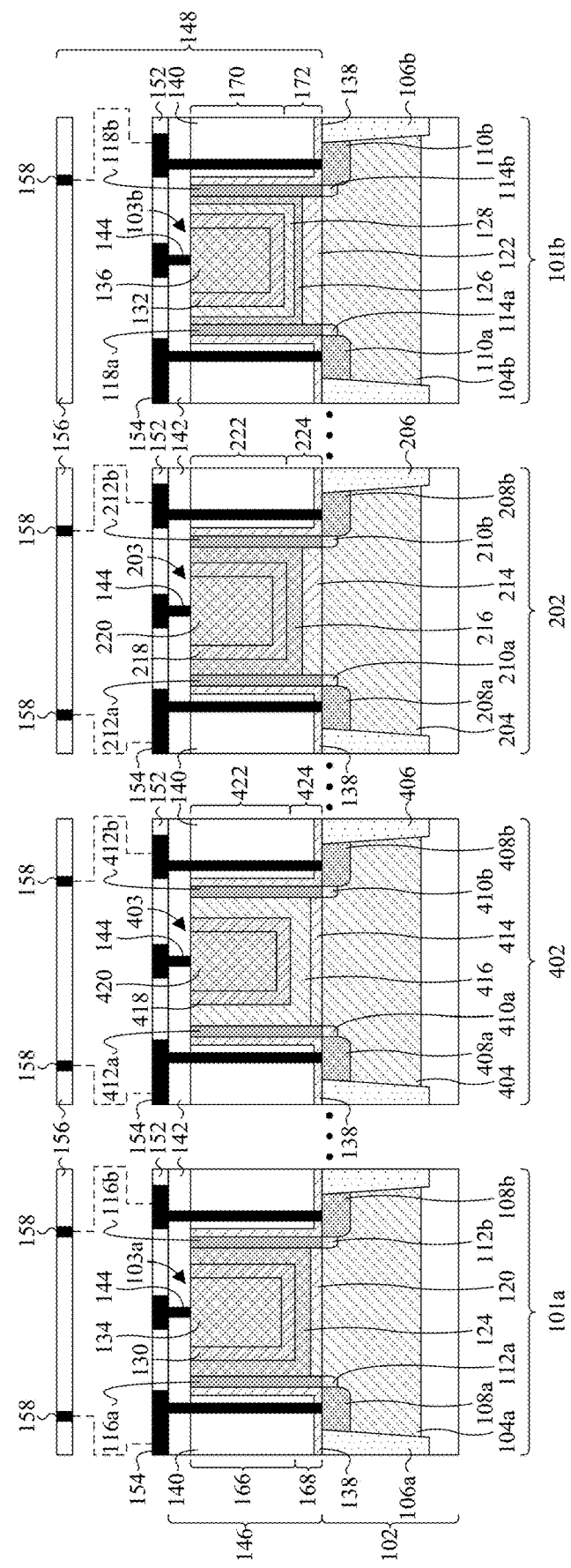

As shown in FIG. 28, a third ILD layer 152 and a plurality of conductive lines 154 (e.g., metal lines) are formed over the second ILD layer 142 and the plurality of conductive contacts 144. In some embodiments, a process for forming the third ILD layer 152 and the plurality of conductive lines 154 comprises depositing the third ILD layer 152 on the second ILD layer 142 and the plurality of conductive contacts 144. In further embodiments, the third ILD layer 152 may be deposited by, for example, CVD, PVD, ALD, sputtering, or some other deposition process.

Thereafter, an etch is performed into the third ILD layer 152 to form conductive line openings that correspond to the plurality of conductive lines 154. The etch may be performed with a masking layer (not shown) formed over the third ILD layer 152. In further embodiments, the process comprises filling the conductive line openings with a conductive material (e.g., copper). The conductive line openings may be filled by depositing a conductive layer (not shown) covering the third ILD layer 152 and filling the conductive line openings. Subsequently, a planarization process (e.g., CMP) is performed into the conductive layer and the third ILD layer 152, thereby forming the plurality of conductive lines 154 in the third ILD layer 152. In further embodiments, the conductive layer may be deposited by, for example, CVD, PVD, ALD, sputtering, electrochemical plating, electroless plating, or some other deposition process.

Also shown in FIG. 28, a fourth ILD layer 156 and a plurality of conductive vias 158 (e.g., metal vias) are formed over the third ILD layer 152 and the plurality of conductive lines 154. In some embodiments, a process for forming the fourth ILD layer 156 and the plurality of conductive vias 158 is substantially the same as the process for forming the third ILD layer 152 and the plurality of conductive lines 154. It will be appreciated that, in some embodiments, this process may be repeated to form additional ILD layers, conductive lines, and/or conductive vias between the third ILD layer 152 and the fourth ILD layer 156.

Figure 29:
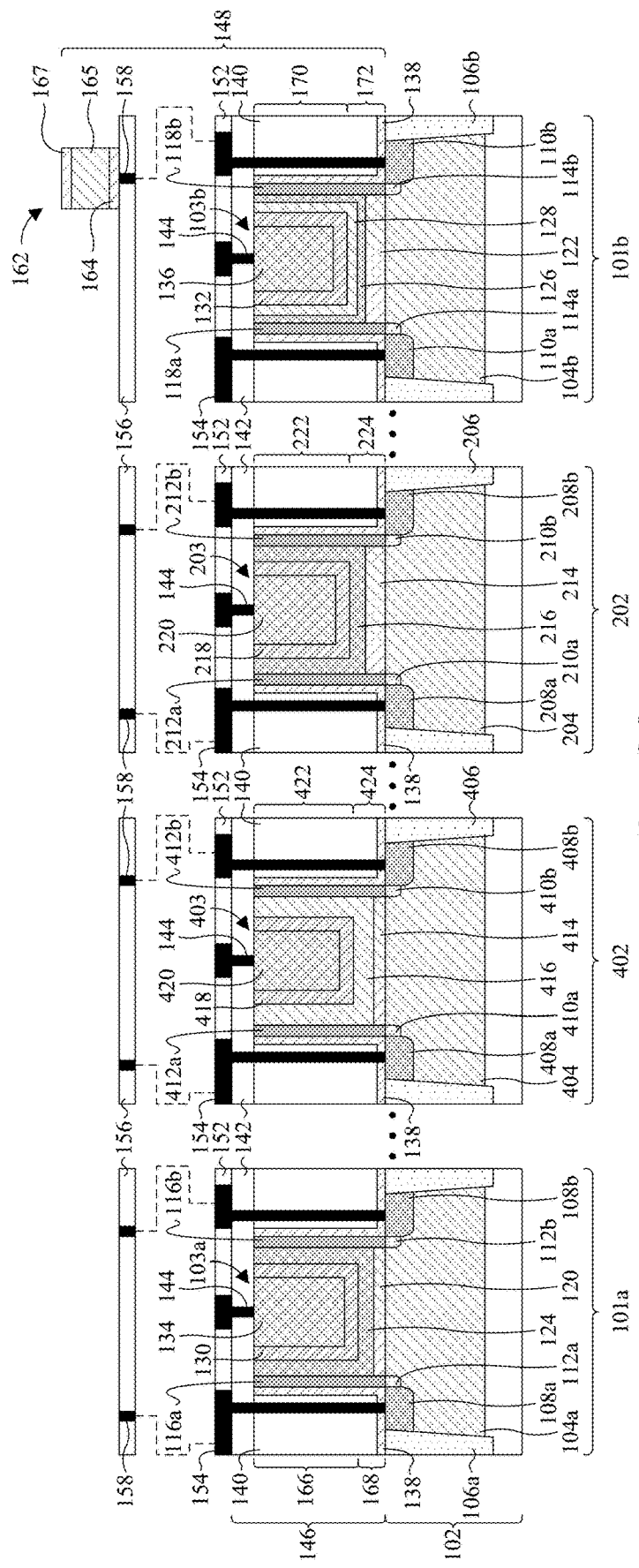

As shown in FIG. 29, a resistive memory cell 162 is formed over the fourth ILD layer 156 and the plurality of conductive vias 158. The resistive memory cell 162 comprises a data storage structure 165 disposed between a first electrode 164 and a second electrode 167. In some embodiments, the first electrode 164 is electrically coupled to the fourth source/drain region 110b via the interconnect structure 148.

In some embodiments, a process for forming the resistive memory cell 162 comprises depositing a first electrode layer on the fourth ILD layer 156 and the plurality of conductive vias 158. A data storage layer is then formed on the first electrode layer, and a second electrode layer is formed on the data storage layer. In some embodiments, the first electrode layer, the data storage layer, and the second electrode layer may be deposited or grown by, for example, CVD, PVD, ALD, sputtering, electrochemical plating, electroless plating, or some other deposition process.

Thereafter, an etch is performed into the second electrode layer, the data storage layer, and the first electrode layer to form a second electrode 167, a data storage structure 165, and a first electrode 164, respectively. In some embodiments, the etch may be performed with a masking layer (not shown) disposed on the second electrode layer. It will be appreciated that, in some embodiments, multiple etches may be performed to form the resistive memory cell 162.

In some embodiments, the first electrode layer and the second electrode layer may comprise, for example, titanium, aluminum, tungsten, gold, platinum, or the like. In some embodiments, the data storage layer may comprise, for example, a chalcogenide (e.g., germanium-antimony-tellurium (GST)), an oxide (e.g., $HFO_2$, $ZrO_2$, etc.), or some other material that may selectively change between a high resistive state (HRS) and a low resistive state (LRS). In further embodiments, the data storage layer may comprise multiple layers configured to store data based on a resistive state of one or more of the multiple layers. For example, the data storage layer may comprise a first ferromagnetic layer (e.g., iron, cobalt, etc.) separated from a second ferromagnetic layer (e.g., iron, cobalt, etc.) by an insulating layer (e.g., germanium oxide, magnesium oxide, etc.) that are patterned into a magnetic tunnel junction (MTJ).

Figure 30:
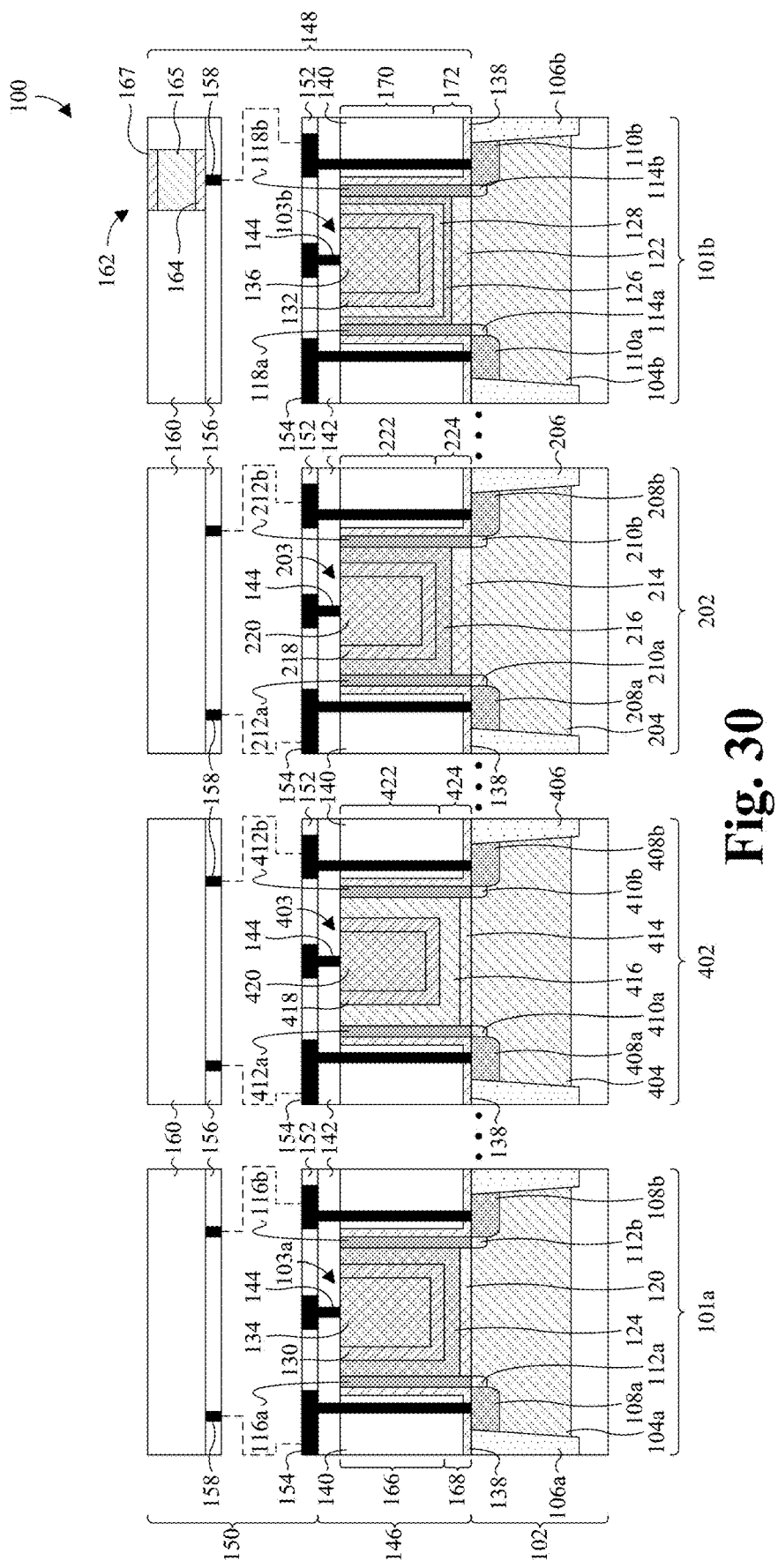

As shown in FIG. 30, a fifth ILD layer 160 is formed on the fourth ILD layer 156 and surrounding the resistive memory cell 162. In some embodiments, the fifth ILD layer 160 is formed with an upper surface that is substantially co-planar with an upper surface of the second electrode 167. In further embodiments, a process for forming the fifth ILD layer 160 comprises depositing the fifth ILD layer 160 on the fourth ILD layer 156 and over the resistive memory cell 162. The fifth ILD layer 160 may be deposited by, for example, CVD, PVD, ALD, sputtering, or some other deposition process.

Thereafter, a planarization process (e.g., CMP) is performed on the fifth ILD layer 160 to remove an upper portion of the fifth ILD layer 160, thereby exposing the second electrode 167. In some embodiments, the planarization process may also remove an upper portion of the second electrode 167. It will be appreciated that, in some embodiments, additional ILD layers, conductive lines, and/or conductive vias may be formed over the fifth ILD layer 160 and the resistive memory cell 162. In further embodiments, formation of an upper portion 150 of the interconnect structure 148 may be complete once the fifth ILD layer 160 has been formed.

Because the thickness of the second dielectric layer 1802 and/or a thickness of the fourth dielectric layer 2302 may be selectively tuned, a gate dielectric capacitance (e.g., a capacitance of the second gate dielectric 172) of the second semiconductor device 103b may be selectively tuned. Therefore, an output voltage of the second semiconductor device 103b (e.g., an output voltage at the fourth source/drain region 110b) may be selectively tuned. In some embodiments, the output voltage of the second semiconductor device 103b is tuned based on an operating voltage (e.g., a RESET voltage) of the resistive memory cell 162. Thus, the output voltage of the second semiconductor device 103b may be selectively tuned, such that the output voltage of the second semiconductor device 103b is sufficient to operate the resistive memory cell 162. Accordingly, as technology nodes decrease, the method provides a means to form an IC 100 comprising the resistive memory cell 162 and the plurality of semiconductor devices 103a/103b/203/403.

Figure 31:
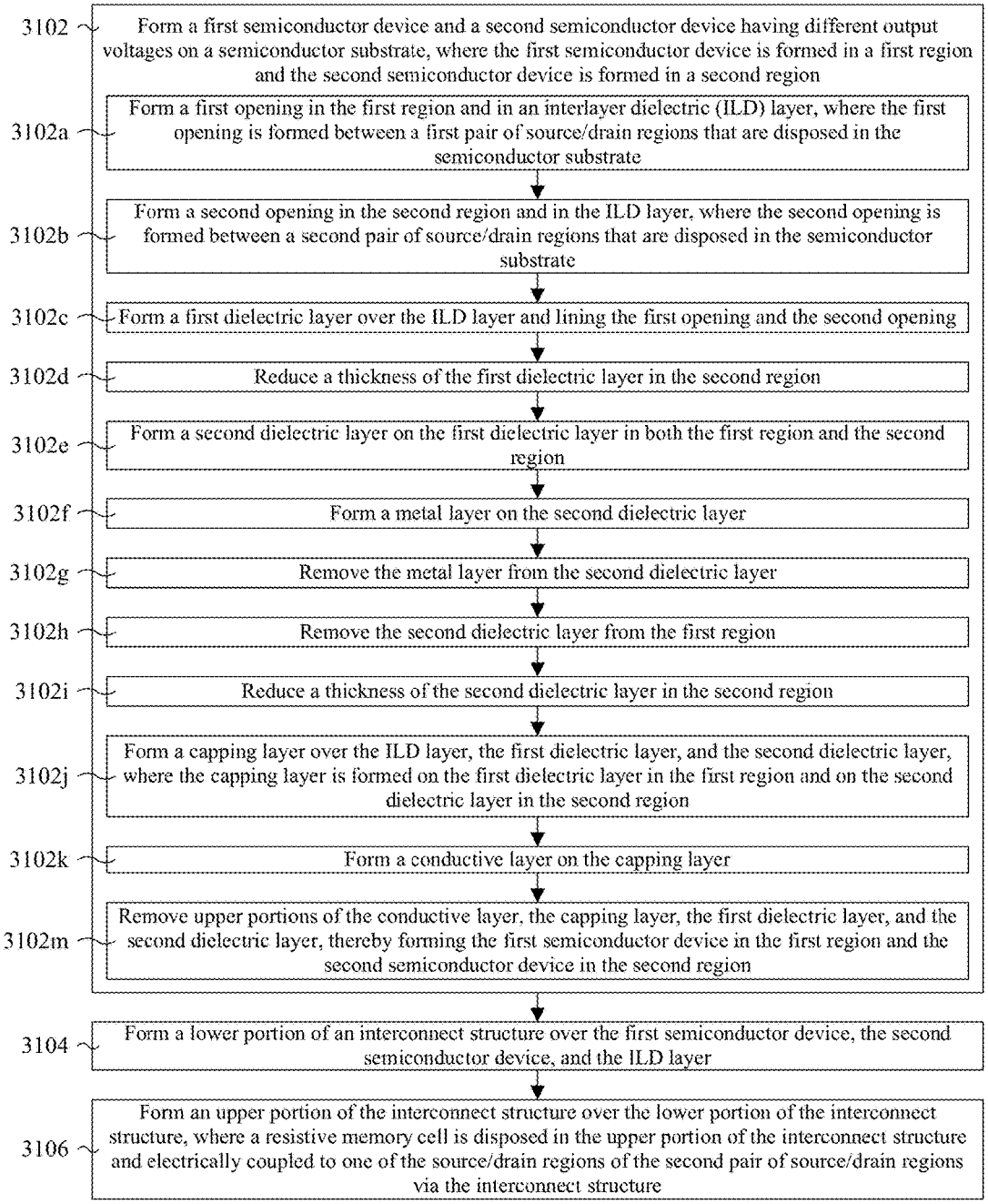
FIG. 31 illustrates a flowchart of some embodiments of a method for forming an IC comprising a first semiconductor device and a second semiconductor device having different output voltages, where the second semiconductor device is electrically coupled to a resistive memory cell.

As illustrated in FIG. 31, a flowchart 3100 of some embodiments of a method for forming an integrated chip (IC) comprising a first semiconductor device and a second semiconductor device having different output voltages, where the second semiconductor device is electrically coupled to a resistive memory cell, is provided. While the flowchart 3100 of FIG. 31 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 3102, a first semiconductor device and a second semiconductor device having different output voltages are formed on a semiconductor substrate, where the first semiconductor device is formed in a first region and the second semiconductor device is formed in a second region. FIGS. 5-26 illustrate various views of some embodiments corresponding to act 3102.

At act 3102a, a first opening is formed in the first region and in an interlayer dielectric (ILD) layer, where the first opening is formed between a first pair of source/drain regions that are disposed in the semiconductor substrate. FIGS. 5-15 illustrate a series of cross-sectional views of some embodiments corresponding to act 3102a.

At act 3102b, a second opening is formed in the second region and in the ILD layer, where the second opening is formed between a second pair of source/drain regions that are disposed in the semiconductor substrate. FIGS. 5-15 illustrate a series of cross-sectional views of some embodiments corresponding to act 3102b.

At act 3102c, a first dielectric layer is formed over the ILD and lining the first opening and the second opening. FIG. 16 illustrates a cross-sectional view of some embodiments corresponding to act 3102c.

At act 3102d, a thickness of the first dielectric layer is reduced in the second region. FIGS. 17-18 illustrate a series of cross-sectional views of some embodiments corresponding to act 3102d. It will be appreciated that, in some embodiments, the thickness of the first dielectric layer may not be reduced in the second region (see, e.g., FIGS. 1-2, 3A, 3D). It will be further appreciated that, in other embodiments, the first dielectric layer may be completely removed in the second region (see, e.g., FIG. 4—the fourth semiconductor device 403).

At act. 3102e, a second dielectric layer is formed on the first dielectric layer in both the first region and the second region. FIG. 19 illustrates a cross-sectional view of some embodiments corresponding to act 3102e.

At act 3102f, a metal layer is formed on the second dielectric layer. FIG. 20 illustrates a cross-sectional view of some embodiments corresponding to act 3102f. In some embodiments, after the first metal layer is formed on the second dielectric layer, a thermal treatment (e.g., anneal) is performed on the metal layer.

At act 3102g, the metal layer is removed from the second dielectric layer. FIG. 21 illustrates a cross-sectional view of some embodiments corresponding to act 3102g.

At act 3102h, the second dielectric layer is removed from the first region. FIG. 22 illustrates a cross-sectional view of some embodiments corresponding to act 3102h.

At act 3102i, a thickness of the second dielectric layer is reduced in the second region. FIG. 23 illustrates a cross-sectional view of some embodiments corresponding to act 3102i. It will be appreciated that, in some embodiments, the thickness of the second dielectric layer may not be reduced in the second region (see, e.g., FIGS. 1-2, 3A, and 3C; and FIG. 4—the fourth semiconductor device 403). It will further be appreciated that, in some embodiments, the metal layer may be formed after act 3102h and/or 3102i. In such embodiments, the metal layer may not be removed from the second dielectric layer.

At 3102j, a capping layer is formed over the ILD layer, the first dielectric layer, and the second dielectric layer, where the capping layer is formed on the first dielectric layer in the first region and on the second dielectric layer in the second region. FIG. 24 illustrates a cross-sectional view of some embodiments corresponding to act 3102j.

At 3102k, a conductive layer is formed on the capping layer. FIG. 25 illustrates a cross-sectional view of some embodiments corresponding to act 3102k.

At 3102m, upper portions of the conductive layer, the capping layer, the first dielectric layer, and the second dielectric layer are removed, thereby forming the first semiconductor device in the first region and the second semiconductor device in the second region. FIG. 26 illustrates a cross-sectional view of some embodiments corresponding to act 3102m.

At 3104, a lower portion of an interconnect structure is formed over the first semiconductor device, the second semiconductor device, and the ILD layer. FIG. 27 illustrates a cross-sectional view of some embodiments corresponding to act 3104.

At 3106, an upper portion of the interconnect structure is formed over the lower portion of the interconnect structure, where a resistive memory cell is disposed in the upper portion of the interconnect structure and electrically coupled to one of source/drain regions of the second pair of source/drain regions via the interconnect structure. FIGS. 28-30 illustrate a series of cross-sectional views of some embodiments corresponding to act 3106.

In some embodiments, the present application provides an integrated chip (IC). The IC comprises a first gate dielectric disposed on a semiconductor substrate, wherein the first gate dielectric comprises a first high-k dielectric structure. A first gate electrode is disposed on the first gate dielectric. A second gate dielectric is disposed on the semiconductor substrate, where the second gate dielectric is spaced from the first gate dielectric in a lateral direction, and where the second gate dielectric comprises a second high-k dielectric structure that has a different chemical composition or a different thickness than the first high-k dielectric structure. A second gate electrode is disposed on the second gate dielectric, where upper surfaces of the first gate electrode, the first high-k dielectric structure, the second high-k dielectric structure, and the second gate electrode are substantially co-planar.

In other embodiments, the present application provides a method for forming an integrated chip (IC). The method comprises forming a first interlayer dielectric (ILD) layer over a semiconductor substrate. A first opening is formed in the first ILD layer and in a first region of the IC. A second opening is formed in the first ILD layer and in a second region of the IC different than the first region. A first high-k dielectric layer is formed lining both the first opening and the second opening. A second high-k dielectric layer is formed on the first high-k dielectric layer, where the second high-k dielectric layer lines the first high-k dielectric layer in both the first region and the second region. The second high-k dielectric layer is removed from the first region. A conductive layer is formed over both the first high-k dielectric layer and the second high-k dielectric layer, wherein the conductive layer contacts the first high-k dielectric layer in the first region and contacts the second high-k dielectric in the second region.

In yet other embodiments, the present application provides a method for forming an integrated chip (IC). The method comprises forming a first interlayer dielectric (ILD) layer over a semiconductor substrate. A first opening is formed in the first ILD layer and in a first region of the IC. A second opening is formed in the first ILD layer and in a second region of the IC different than the first region. A first high-k dielectric layer is formed lining both the first opening and the second opening, where the first high-k dielectric layer has a first thickness in the first region and a second thickness in the second region. A first etch is performed to reduce the thickness of the first high-k dielectric layer in the second region from the second thickness to a third thickness, where the third thickness is less than the first thickness after the first etch. A second high-k dielectric layer is formed on the first high-k dielectric layer and in both the first region and the second region, where the second high-k dielectric layer has a fourth thickness in the second region. A second etch is performed to reduce the thickness of the second high-k dielectric layer in the second region from the fourth thickness to a fifth thickness. The second high-k dielectric layer is removed from the first region. A conductive layer is formed over the first high-k dielectric layer and the second high-k dielectric layer, where the conductive layer contacts the first high-k dielectric layer in the first region and contacts the second high-k dielectric in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:
   forming an interlayer dielectric (ILD) layer over a semiconductor substrate;
   forming a first opening in the ILD layer and in a first region of the IC;
   forming a second opening in the ILD layer and in a second region of the IC different than the first region;
   forming a first high-k dielectric layer lining both the first opening and the second opening;
   forming a second high-k dielectric layer on the first high-k dielectric layer, wherein the second high-k dielectric layer lines the first high-k dielectric layer in both the first region and the second region;

after the second high-k dielectric layer is formed on the first high-k dielectric layer, reducing a thickness of the second high-k dielectric layer in the second region;

removing the second high-k dielectric layer from the first region; and forming a conductive layer over both the first high-k dielectric layer and the second high-k dielectric layer, wherein the conductive layer is vertically spaced from the first high-k dielectric layer in the first region by a first distance, and wherein the conductive layer is vertically spaced from the first high-k dielectric layer in the second region by a second distance that is greater than the first distance.

2. The method of claim 1, wherein reducing the thickness of the second high-k dielectric layer in the second region comprises:

performing a first etch on the second high-k dielectric layer for a period of time, wherein the first etch linearly reduces the thickness of the second high-k dielectric layer as the period of time increases.

3. The method of claim 2, further comprising:

before the ILD layer is formed, forming a pair of first source/drain regions in the semiconductor substrate and laterally spaced, wherein the first opening is formed between the first source/drain regions;

before the ILD layer is formed, forming a pair of second source/drain regions in the semiconductor substrate and laterally spaced, wherein the second opening is formed between the second source/drain regions; and performing a planarization process into the conductive layer, the first high-k dielectric layer, and the second high-k dielectric layer, thereby forming:

a first metal gate disposed over the semiconductor substrate and between the first source/drain regions, wherein a first portion of the first high-k dielectric layer separates the first metal gate from the semiconductor substrate; and a second metal gate disposed over the semiconductor substrate and between the second source/drain regions, wherein both a second portion of the first high-k dielectric layer and a third portion of the second high-k dielectric layer separate the second metal gate from the semiconductor substrate.

4. The method of claim 3, further comprising:

forming a resistive memory cell over the ILD layer, the first metal gate, and the second metal gate, wherein the resistive memory cell comprises a data storage structure disposed between a first resistive memory cell electrode and a second resistive memory cell electrode, and wherein the first resistive memory cell electrode is electrically coupled to one of the second source/drain regions.

5. The method of claim 1, further comprising:

before the second high-k dielectric layer is formed, performing a second etch on the first high-k dielectric layer to reduce a thickness of the first high-k dielectric layer in the second region, such that the first high-k dielectric layer has a third thickness in the first region and a fourth thickness that is less than the third thickness in the second region.

6. The method of claim 1, further comprising:

before the conductive layer is formed, forming a capping layer over both the first high-k dielectric layer and the second high-k dielectric layer, wherein the capping layer contacts the first high-k dielectric layer in the first opening and contacts the second high-k dielectric layer in the second opening, and wherein the conductive layer is formed over the capping layer.

7. The method of claim 1, wherein:

the first high-k dielectric layer has a first chemical composition; and the second high-k dielectric layer has a second chemical composition different than the first chemical composition.

8. A method for forming an integrated chip (IC), the method comprising:

forming an interlayer dielectric (ILD) layer over a semiconductor substrate;

forming a first opening in the ILD layer and in a first region of the IC;

forming a second opening in the ILD layer and in a second region of the IC different than the first region;

forming a first high-k dielectric layer lining both the first opening and the second opening, wherein the first high-k dielectric layer is formed with a first thickness in both the first region and the second region;

performing a first etch to reduce the first thickness of the first high-k dielectric layer in the second region to a second thickness;

forming a second high-k dielectric layer on the first high-k dielectric layer and in both the first region and the second region, wherein the second high-k dielectric layer is formed with a third thickness in both the first region and the second region;

removing the second high-k dielectric layer from the first region;

performing a second etch to reduce the third thickness of the second high-k dielectric layer in the second region to a fourth thickness; and forming a conductive layer over the first high-k dielectric layer and the second high-k dielectric layer, wherein the conductive layer is vertically spaced from the first high-k dielectric layer in the first region by a first distance, and wherein the conductive layer is vertically spaced from the first high-k dielectric layer in the second region by a second distance that is greater than the first distance.

9. The method of claim 8, further comprising:

performing a planarization process into the conductive layer, the second high-k dielectric layer, and the first high-k dielectric layer, thereby forming:

a first gate electrode in the first region;

a first high-k dielectric structure in the first region and between the first gate electrode and the ILD layer, wherein the first high-k dielectric structure is a first portion of the first high-k dielectric layer having the first thickness;

a second gate electrode in the second region;

a second high-k dielectric structure in the second region and between the second gate electrode and the ILD layer, wherein the second high-k dielectric structure is a second portion of the first high-k dielectric layer having the second thickness; and a third high-k dielectric structure in the second region and between the second gate electrode and the second high-k dielectric structure, wherein the third high-k dielectric structure is a portion of the second high-k dielectric layer having the fourth thickness.

10. The method of claim 8, further comprising:

before the conductive layer is formed, forming a capping layer over both the first high-k dielectric layer and the second high-k dielectric layer, wherein the capping layer contacts the first high-k dielectric layer in the first opening and contacts the second high-k dielectric layer in the second opening, and wherein the conductive layer is formed over the capping layer.

11. A method for forming an integrated chip (IC), the method comprising:
   forming a sacrificial dielectric structure over a semiconductor substrate;
   forming a first interfacial layer (IL) over the semiconductor substrate and laterally spaced from the sacrificial dielectric structure, wherein the first IL is formed with a first thickness;
   forming a first sacrificial gate structure overlying the sacrificial dielectric structure;
   forming a second sacrificial gate structure overlying the first IL;
   forming an interlayer dielectric (ILD) layer over the semiconductor substrate and laterally surrounding the sacrificial dielectric structure, the first sacrificial gate structure, the first IL, and the second sacrificial gate structure;
   removing the first sacrificial gate structure, thereby forming a first opening in the ILD layer that exposes the sacrificial dielectric structure;
   removing the second sacrificial gate structure, thereby forming a second opening in the ILD layer that exposes the first IL;
   removing the sacrificial dielectric structure, thereby extending a depth of the first opening and exposing a portion of the semiconductor substrate;
   forming a second IL having a second thickness that is less than the first thickness on the portion of the semiconductor substrate, thereby reducing the depth of the first opening by the second thickness;
   after the second IL is formed, forming a first high-k dielectric layer over the ILD layer, the first IL, and the second IL, wherein a first section of the first high-k dielectric layer lines the first opening and contacts the second IL, and wherein a second section of the first high-k dielectric layer lines the second opening and contacts the first IL;
   forming a second high-k dielectric layer over the first high-k dielectric layer and the ILD layer, wherein a first section of the second high-k dielectric layer lines the first section of the first high-k dielectric layer, and wherein a second section of the second high-k dielectric layer lines the second section of the first high-k dielectric layer;
   removing the first section of the second high-k dielectric layer; and
   forming a conductive layer over both the first high-k dielectric layer and the second high-k dielectric layer and filling both the first opening and the second opening, wherein the conductive layer is vertically spaced from the first section of the first high-k dielectric layer by a first distance, and wherein the conductive layer is vertically spaced from the second section of the first high-k dielectric layer by a second distance that is greater than the first distance.

12. The method of claim 11, wherein:
   the first IL has a first dielectric constant;
   the second IL has a second dielectric constant;
   the first high-k dielectric layer has a third dielectric constant that is greater than both the first dielectric constant and the second dielectric constant; and
   the second high-k dielectric layer has a fourth dielectric constant that is greater than both the first dielectric constant and the second dielectric constant.

13. The method of claim 12, wherein both the first IL and the second IL are a same dielectric material.

14. The method of claim 11, wherein:
   the first high-k dielectric layer has a first chemical composition; and
   the second high-k dielectric layer has a second chemical composition different than the first chemical composition.

15. The method of claim 11, further comprising:
   before the conductive layer is formed, forming a capping layer over the ILD layer, the first high-k dielectric layer, and the second high-k dielectric layer, wherein the capping layer lines the first section of the first high-k dielectric layer and lines the second section of the second high-k dielectric layer, and wherein the conductive layer is formed over the capping layer.

16. The method of claim 11, further comprising:
   before the second high-k dielectric layer is formed, forming a masking layer that covers the first section of the first high-k dielectric layer; and
   with the masking layer covering the first section of the first high-k dielectric layer, performing a first etching process that reduces a thickness of the second section of the first high-k dielectric layer.

17. The method of claim 11, further comprising:
   after the second high-k dielectric layer is formed, performing a first etching process that reduces a thickness of the second section of the second high-k dielectric layer.

18. The method of claim 11, further comprising:
   before the second high-k dielectric layer is formed, forming a masking layer that covers the first section of the first high-k dielectric layer;
   with the masking layer covering the first section of the first high-k dielectric layer, performing a first etching process that reduces a thickness of the second section of the first high-k dielectric layer;
   after the first etching process, removing the masking layer, wherein the second high-k dielectric layer is formed after the masking layer is removed; and
   after the second high-k dielectric layer is formed, performing a second etching process that reduces a thickness of the second section of the second high-k dielectric layer.

19. The method of claim 11, further comprising:
   performing a planarization process into the ILD layer, the conductive layer, the second high-k dielectric layer, and the first high-k dielectric layer, thereby forming:
      a first conductive structure overlying the second IL, wherein the first conductive structure is a first portion of the conductive layer remaining after the planarization process;
      a second conductive structure overlying the first IL, wherein the second conductive structure is a second portion of the conductive layer remaining after the planarization process;
      a first high-k dielectric structure overlying the second IL and between the first conductive structure and the second IL, wherein the first high-k dielectric structure is a portion of the first section of the first high-k dielectric layer remaining after the planarization process;

a second high-k dielectric structure overlying the first IL and between the second conductive structure and the first IL, wherein the second high-k dielectric structure is a portion of the second section of the first high-k dielectric layer remaining after the planarization process; and a third high-k dielectric structure overlying the first IL and between the second conductive structure and the second high-k dielectric structure, wherein the third high-k dielectric structure is a portion of the second section of the second high-k dielectric layer remaining after the planarization process, and wherein an upper surface of the ILD layer, an upper surface of the first conductive structure, an upper surface of the second conductive structure, an upper surface of the first high-k dielectric structure, an upper surface of the second high-k dielectric structure, and an upper surface of the third high-k dielectric structure are co-planar.

20. The method of claim 19, further comprising:

forming a pair of first source/drain regions in the semiconductor substrate and laterally spaced, wherein the first opening is formed between the first source/drain regions;

forming a pair of second source/drain regions in the semiconductor substrate and laterally spaced, wherein the second opening is formed between the second source/drain regions; and forming a resistive memory cell over the ILD layer, the first conductive structure, the second conductive structure, the first high-k dielectric structure, the second high-k dielectric structure, and the third high-k dielectric structure, wherein the resistive memory cell comprises a data storage structure disposed between a first resistive memory cell electrode and a second resistive memory cell electrode, and wherein the first resistive memory cell electrode is electrically coupled to one of the second source/drain regions.

* * * * *